(12) United States Patent
Pitner et al.

(10) Patent No.: US 11,568,943 B2
(45) Date of Patent: Jan. 31, 2023

(54) MEMORY APPARATUS AND METHOD OF OPERATION USING ZERO PULSE SMART VERIFY

(71) Applicant: SanDisk Technologies LLC, Addison, TX (US)

(72) Inventors: Xue Bai Pitner, Sunnyvale, CA (US); Dengtao Zhao, Los Gatos, CA (US); Deepanshu Dutta, Fremont, CA (US); Ravi Kumar, Redwood City, CA (US)

(73) Assignee: SanDisk Technologies LLC, Addison, TX (US)

( * ) Notice: Subject to any disclaimer, the term of this patent is extended or adjusted under 35 U.S.C. 154(b) by 0 days.

(21) Appl. No.: 17/102,954

(22) Filed: Nov. 24, 2020

(65) Prior Publication Data

US 2022/0165341 A1 May 26, 2022

(51) Int. Cl.
*G11C 16/34* (2006.01)
*G11C 16/30* (2006.01)
*G11C 16/26* (2006.01)
*G11C 16/08* (2006.01)
*G11C 16/14* (2006.01)

(52) U.S. Cl.
CPC .......... *G11C 16/3445* (2013.01); *G11C 16/08* (2013.01); *G11C 16/14* (2013.01); *G11C 16/26* (2013.01); *G11C 16/30* (2013.01); *G11C 16/3404* (2013.01)

(58) Field of Classification Search
CPC ..... G11C 16/3445; G11C 16/08; G11C 16/14; G11C 16/26; G11C 16/30; G11C 16/3404
See application file for complete search history.

(56) References Cited

U.S. PATENT DOCUMENTS

| 7,023,736 | B2 | 4/2006 | Cernea et al. |
| 7,046,568 | B2 | 5/2006 | Cernea |
| 7,196,928 | B2 | 3/2007 | Chen |
| 7,196,931 | B2 | 3/2007 | Cernea et al. |
| 7,327,619 | B2 | 2/2008 | Chan et al. |
| 7,907,449 | B2 | 3/2011 | Lee et al. |
| 8,214,700 | B2 | 7/2012 | Chen |
| 8,861,280 | B2 | 10/2014 | Costa et al. |
| 9,036,415 | B2 | 5/2015 | Sharon |
| 9,214,240 | B2 | 12/2015 | Dutta et al. |
| 9,269,446 | B1 | 2/2016 | Magia et al. |
| 9,852,800 | B2 * | 12/2017 | Lang ...................... G11C 16/16 |

(Continued)

*Primary Examiner* — Vanthu T Nguyen
(74) *Attorney, Agent, or Firm* — Dickinson Wright PLLC; Steven C. Hurles

(57) ABSTRACT

A memory apparatus and method of operation is provided. The apparatus includes a block of memory cells. Each of the memory cells is connected to one of a plurality of word lines and are also arranged in strings and configured to retain a threshold voltage within a common range of threshold voltages. A control circuit coupled to the plurality of word lines and the strings is configured to determine an erase upper tail voltage of a distribution of the threshold voltage of the memory cells following an erase operation. The erase upper tail voltage corresponds to a cycling condition of the memory cells. The control circuit is also configured to calculate a program voltage to apply to each of selected ones of the plurality of word lines associated with the memory cells to program the memory cells during a program operation based on the erase upper tail voltage.

19 Claims, 17 Drawing Sheets

(56) References Cited

U.S. PATENT DOCUMENTS

| | | | | |
|---|---|---|---|---|
| 9,916,906 B2* | 3/2018 | Wu | .................. | G11C 16/349 |
| 10,304,543 B2* | 5/2019 | Senoo | .................. | G11C 16/16 |
| 2018/0374551 A1* | 12/2018 | Hu | .................. | G11C 16/349 |
| 2019/0051362 A1* | 2/2019 | Lee | .................. | G11C 16/0483 |

* cited by examiner

MEMORY APPARATUS AND METHOD OF OPERATION USING ZERO PULSE SMART VERIFY

FIELD

This application relates to non-volatile memory apparatuses and the operation of non-volatile memory apparatuses.

BACKGROUND

This section provides background information related to the technology associated with the present disclosure and, as such, is not necessarily prior art.

Semiconductor memory is used in various electronic devices. For example, non-volatile semiconductor memory is used in cellular telephones, digital cameras, personal digital assistants, mobile computing devices, non-mobile computing devices and other devices. Electrical Erasable Programmable Read Only Memory (EEPROM) and flash memory are among the most popular non-volatile semiconductor memories.

Some non-volatile memory utilizes a floating gate that is positioned above and insulated from a channel region in a semiconductor substrate. The floating gate is positioned between the source and drain regions. A control gate is provided over and insulated from the floating gate. The threshold voltage of the transistor is controlled by the amount of charge that is retained on the floating gate. That is, the minimum amount of voltage that must be applied to the control gate before the transistor is turned on to permit conduction between its source and drain is controlled by the level of charge on the floating gate.

Some non-volatile memory utilizes a charge trapping layer to store information. One such example has an oxide-nitride-oxide (ONO) region, in which the nitride (e.g., SiN) serves as a charge trapping layer to store information. When such a memory cell is programmed, electrons are stored in the charge trapping layer.

Non-volatile memory could have a 2D architecture or a 3D architecture. Ultra high density storage devices have been employed using a 3D stacked memory structure having strings of memory cells. One such storage device is sometimes referred to as a Bit Cost Scalable (BiCS) architecture. For example, a 3D NAND stacked memory device can be formed from an array of alternating conductor and insulator layers. The conductor layers may function as word lines. A memory hole is drilled in the layers to define many memory layers simultaneously. A NAND string is then formed by filling the memory hole with appropriate materials. A straight NAND string extends in one memory hole, while a pipe- or U-shaped NAND string (P-BiCS) includes a pair of vertical columns of memory cells which extend in two memory holes and which are joined by a pipe connection. The pipe connection may be made of undoped polysilicon. A back gate may surround the pipe connection to control conduction of the pipe connection. Control gates of the memory cells are provided by the conductor layers.

Prior to programming certain non-volatile memory devices, such as a NAND flash memory device, the memory cells are typically erased. The erase operation removes electrons from the floating gate, for some devices. For other devices, the erase operation removes electrons from the charge trapping layer. After erasing, it is necessary to determine a program voltage to be used to program the memory cells in a program operation. As the memory cells are repeatedly programmed and erased, the program voltage used may need to be adjusted accordingly.

SUMMARY

This section provides a general summary of the present disclosure and is not a comprehensive disclosure of its full scope or all of its features and advantages.

An object of the present disclosure is to provide a memory apparatus and a method of operating the memory apparatus that address and overcome the above-noted shortcomings.

Accordingly, it is an aspect of the present disclosure to provide an apparatus including a block of memory cells. Each of the memory cells is connected to one of a plurality of word lines. The memory cells are also arranged in strings and are configured to retain a threshold voltage within a common range of threshold voltages defining a threshold window. A control circuit is coupled to the plurality of word lines and the strings. The control circuit is configured to determine an erase upper tail voltage of a distribution of the threshold voltage of the memory cells following an erase operation. The erase upper tail voltage corresponds to a cycling condition of the memory cells. The control circuit is also configured to calculate a program voltage to apply to each of selected ones of the plurality of word lines associated with the memory cells to program the memory cells during a program operation based on the erase upper tail voltage.

According to another aspect of the disclosure a controller in communication with a memory apparatus including a block of memory cells. Each of the memory cells is connected to one of a plurality of word lines. The memory cells are arranged in strings and are configured to retain a threshold voltage within a common range of threshold voltages defining a threshold window. The controller is configured to determine an erase upper tail voltage of a distribution of the threshold voltage of the memory cells following an erase operation. The erase upper tail voltage corresponds to a cycling condition of the memory cells. The controller is additionally configured to calculate a program voltage to apply to each of selected ones of the plurality of word lines associated with the memory cells to program the memory cells during a program operation based on the erase upper tail voltage.

According to an additional aspect of the disclosure a method of operating a memory apparatus is provided. The memory apparatus includes a block of memory cells. Each of the memory cells is connected to one of a plurality of word lines. The memory cells are arranged in strings and are configured to retain a threshold voltage within a common range of threshold voltages defining a threshold window. The method includes the step of determining an erase upper tail voltage of a distribution of the threshold voltage of the memory cells following an erase operation, the erase upper tail voltage corresponding to a cycling condition of the memory cells. The method continues with the step of calculating a program voltage to apply to each of selected ones of the plurality of word lines associated with the memory cells to program the memory cells during a program operation based on the erase upper tail voltage.

Further areas of applicability will become apparent from the description provided herein. The description and specific examples in this summary are intended for purposes of illustration only and are not intended to limit the scope of the present disclosure.

DRAWINGS

The drawings described herein are for illustrative purposes only of selected embodiments and not all possible implementations, and are not intended to limit the scope of the present disclosure.

Figure 11A:
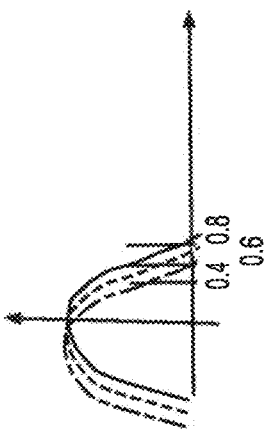
Figure 11B:
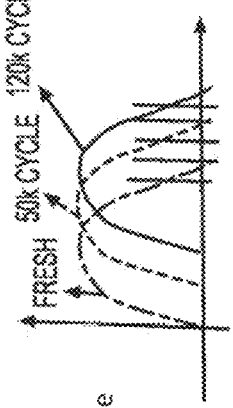
Figure 11C:
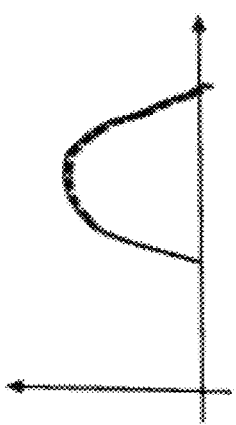
Figure 11D:
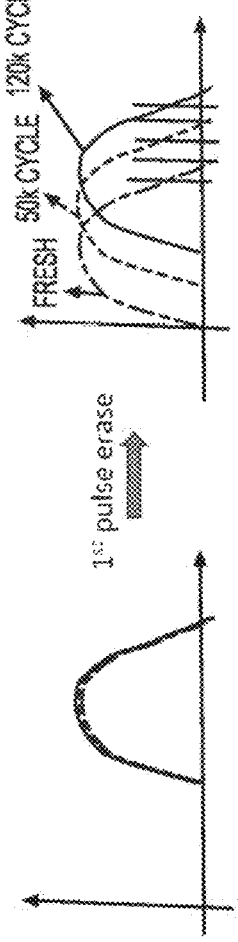
Figure 11E:
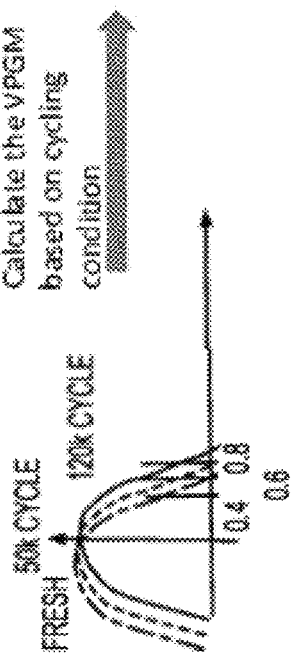
Figure 11F:
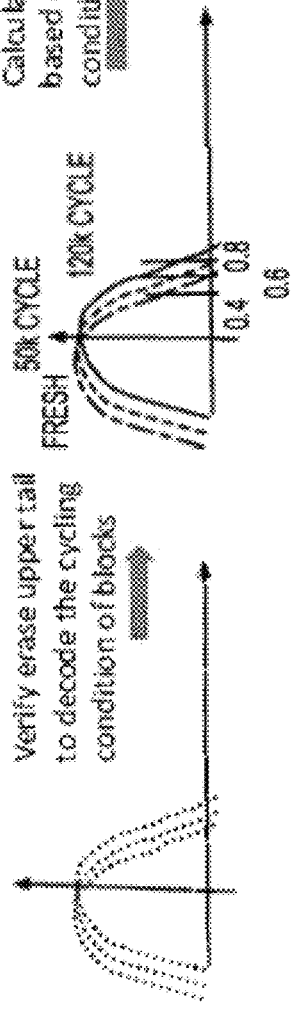
Figure 12:
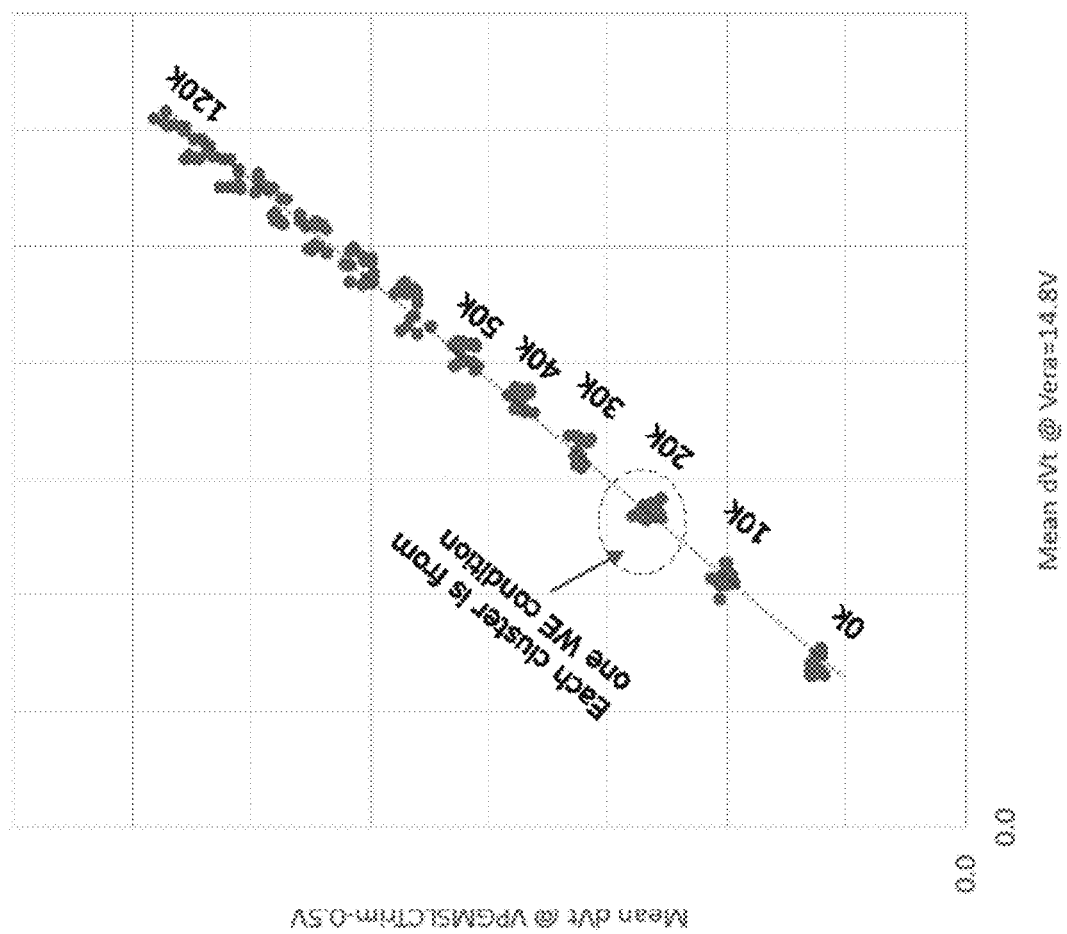
Figure 13:
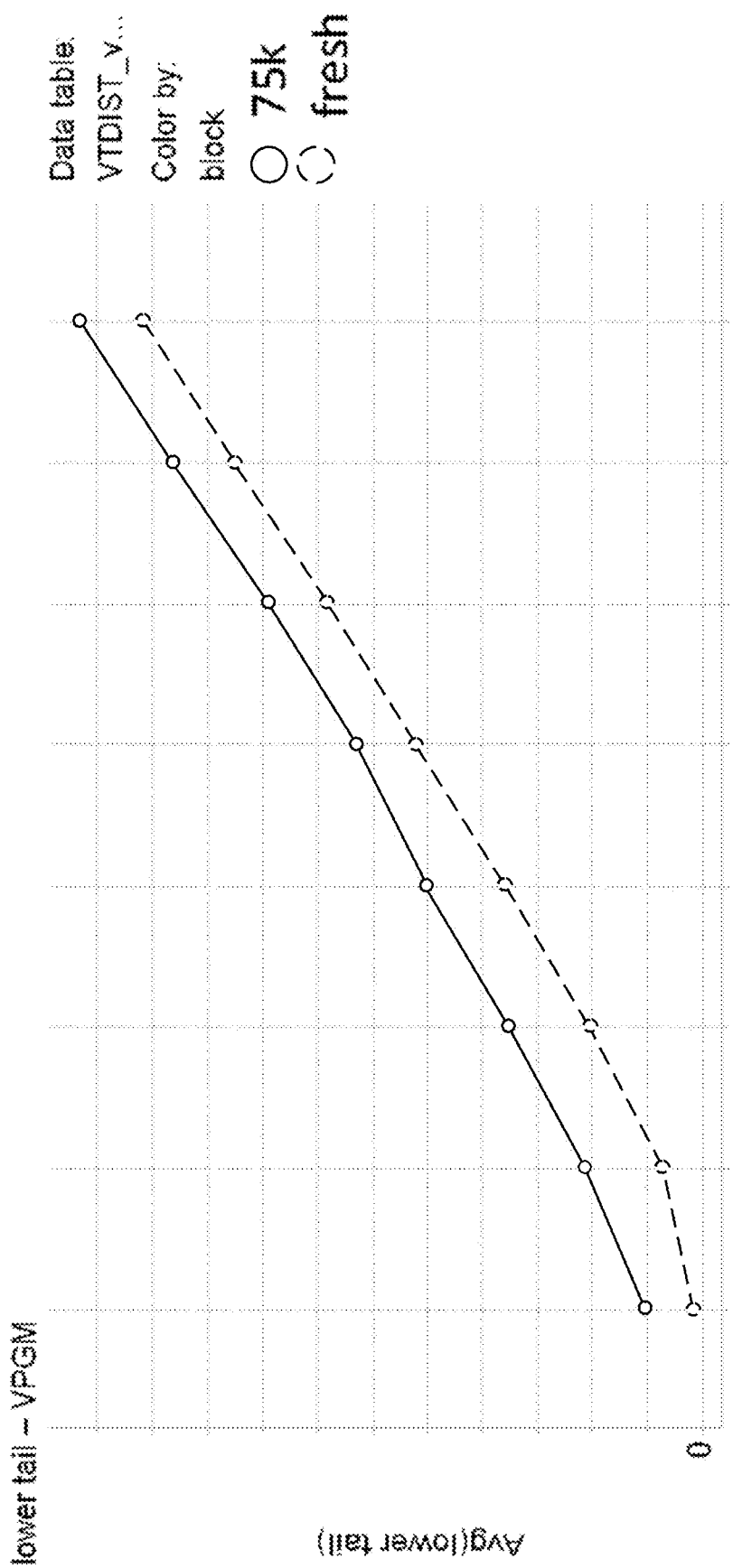
Figure 14:
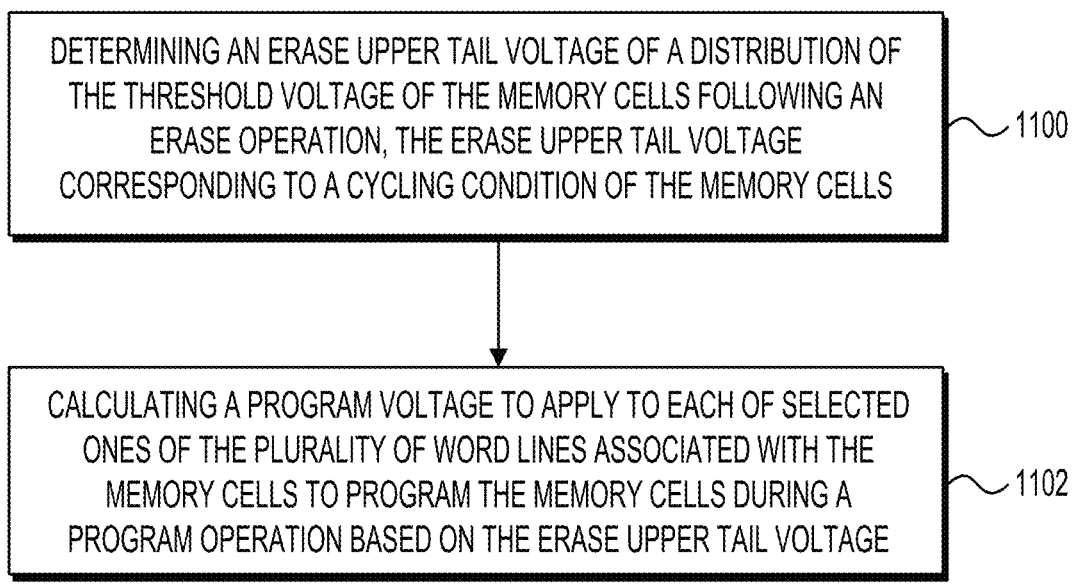

FIG. 11A shows an example distribution of the threshold voltage of the memory cells for blocks with different cycling conditions prior to the erase operation, FIG. 11B shows an example distribution of the threshold voltages of the memory cells for blocks with different cycling conditions after the first erase pulse, FIG. 11C shows an example distribution of the threshold voltages of the memory cells for blocks with different cycling conditions after the second erase pulse, FIG. 11D shows an example distribution of the threshold voltages of the memory cells for blocks with different cycling conditions prior to the start of the program operation, FIG. 11E shows an example distribution of the threshold voltages of the memory cells for blocks with different cycling conditions after a control circuit has determined the erase upper tail location, and FIG. 11F shows an example distribution of the threshold voltages of the memory cells for blocks with different cycling conditions after the control circuit has programmed the memory cells during the program operation according to aspects of the disclosure;

FIG. 12 is a graph showing a correlation between program and erase speeds for memory cells under different cycling conditions according to aspects of the disclosure;

FIG. 13 is a graph showing an average lower tail following the program operation versus the program voltage for a fresh memory apparatus and one that has experienced 75,000 program and erase cycles according to aspects of the disclosure; and FIG. 14 illustrates steps of a method of operating a memory apparatus according to aspects of the disclosure.

DETAILED DESCRIPTION

In the following description, details are set forth to provide an understanding of the present disclosure. In some instances, certain circuits, structures and techniques have not been described or shown in detail in order not to obscure the disclosure.

In general, the present disclosure relates to non-volatile memory apparatuses of the type well-suited for use in many applications. The non-volatile memory apparatus and associated methods of operation of this disclosure will be described in conjunction with one or more example embodiments. However, the specific example embodiments disclosed are merely provided to describe the inventive concepts, features, advantages and objectives with sufficient clarity to permit those skilled in this art to understand and practice the disclosure. Specifically, the example embodiments are provided so that this disclosure will be thorough, and will fully convey the scope to those who are skilled in the art. Numerous specific details are set forth such as examples of specific components, devices, and methods, to provide a thorough understanding of embodiments of the present disclosure. It will be apparent to those skilled in the art that specific details need not be employed, that example embodiments may be embodied in many different forms and that neither should be construed to limit the scope of the disclosure. In some example embodiments, well-known processes, well-known device structures, and well-known technologies are not described in detail.

In some memory devices or apparatuses, memory cells are joined to one another such as in NAND strings in a block or sub-block. Each NAND string comprises a number of memory cells connected in series between one or more drain-side SG transistors (SGD transistors), on a drain-side of the NAND string which is connected to a bit line, and one or more source-side SG transistors (SGS transistors), on a source-side of the NAND string which is connected to a source line. Further, the memory cells can be arranged with a common control gate line (e.g., word line) which acts a control gate. A set of word lines extends from the source side of a block to the drain side of a block. Memory cells can be connected in other types of strings and in other ways as well.

In a 3D memory structure, the memory cells may be arranged in vertical strings in a stack, where the stack comprises alternating conductive and dielectric layers. The conductive layers act as word lines which are connected to the memory cells. The memory cells can include data memory cells, which are eligible to store user data, and dummy or non-data memory cells which are ineligible to store user data.

Before programming certain non-volatile memory devices, the memory cells are typically erased. For some devices, the erase operation removes electrons from the floating gate of the memory cell being erased. Alternatively, the erase operation removes electrons from the charge trapping layer.

During a program operation, the memory cells are programmed according to a word line programming order. For example, the programming may start at the word line at the source side of the block and proceed to the word line at the drain side of the block. In one approach, each word line is completely programmed before programming a next word line. For example, a first word line, WL0, is programmed using one or more programming pulses until the programming is completed. Next, a second word line, WL1, is programmed using one or more programming pulses until the programming is completed, and so forth. A programming pulse may include a set of increasing program voltages which are applied to the word line in respective program loops or program-verify iterations. Verify operations or stages may be performed after each program voltage to determine whether the memory cells have completed programming. When programming is completed for a memory cell, it can be locked out from further programming while programming continues for other memory cells in subsequent program loops.

Each memory cell may be associated with a data state according to write data in a program command. Based on its data state, a memory cell will either remain in the erased state or be programmed to a programmed data state. For example, in a one bit per cell memory device, there are two data states including the erased state and the programmed state (see FIG. 7).

After the memory cells are programmed, the data can be read back in a read operation. A read operation can involve applying a series of read voltages to a word line while sensing circuitry determines whether cells connected to the word line are in a conductive or non-conductive state. If a cell is in a non-conductive state, the threshold voltage Vt or Vth of the memory cell exceeds the read voltage. The read voltages are set at levels which are expected to be between the threshold voltage levels of adjacent data states.

As the program voltage is applied to the word lines associated with the memory cells being programmed during the program operation, it is necessary to determine a program voltage VPGM to be used to program the memory cells in a program operation (voltage applied to the corresponding word lines). The program voltage utilized may need to be adjusted as the memory cells are cycled (i.e., repeatedly programmed and erased). One approach to determining the program voltage is to utilize one or more pulses of the program voltage followed by reading or verifying the threshold voltage of the selected memory cells (such an approach may be known as "smart verify"). Nevertheless, applying one or more pulses to determine the correct program voltage can significantly impact the speed of the program operation.

Figure 1A:
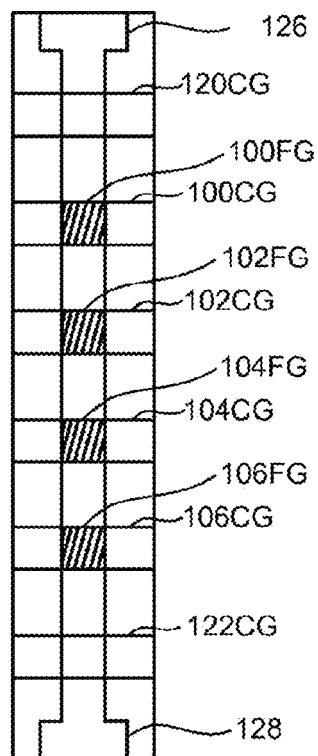
FIG. 1A is a top view of a NAND string according to aspects of the disclosure.
Figure 1B:
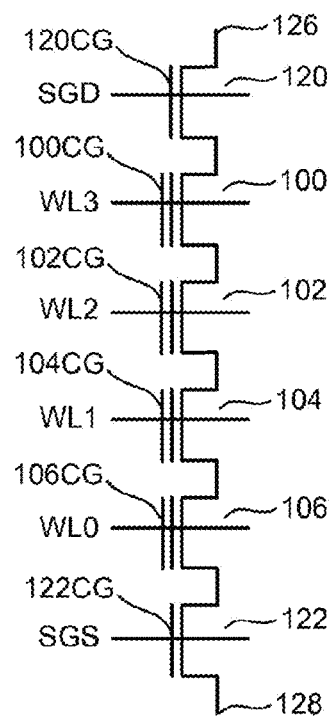
FIG. 1B is an equivalent circuit diagram of the NAND string of FIG. 1A according to aspects of the disclosure.

Techniques disclosed herein may be applied to 3D NAND, but are not necessarily limited thereto. A NAND flash memory structure may arrange multiple transistors in series between two select gates. The transistors in series and the select gates are referred to as a NAND string. FIG. 1A is a top view showing one NAND string. FIG. 1B is an equivalent circuit thereof. The NAND string depicted in FIGS. 1A and 1B includes four transistors, 100, 102, 104 and 106, in series and sandwiched between a first select gate 120 and a second select gate 122. Select gate 120 connects the NAND string to bit line 126. Select gate 122 connects the NAND string to source line 128. Select gate 120 is controlled by applying the appropriate voltages to control gate 120CG. Select gate 122 is controlled by applying the appropriate voltages to control gate 122CG. Each of the transistors 100, 102, 104 and 106 has a control gate and a floating gate. Transistor 100 has control gate 100CG and floating gate 100FG. Transistor 102 includes control gate 102CG and floating gate 102FG. Transistor 104 includes control gate 104CG and floating gate 104FG. Transistor 106 includes a control gate 106CG and floating gate 106FG. Control gate 100CG is connected to word line WL3, control gate 102CG is connected to word line WL2, control gate 104CG is connected to word line WL1, and control gate 106CG is connected to word line WL0. In one embodiment, transistors 100, 102, 104 and 106 are each memory cells. In other embodiments, the memory cells may include multiple transistors or may be different than that depicted. Select gate 120 is connected to select line SGD. Select gate 122 is connected to select line SGS.

Figure 2:
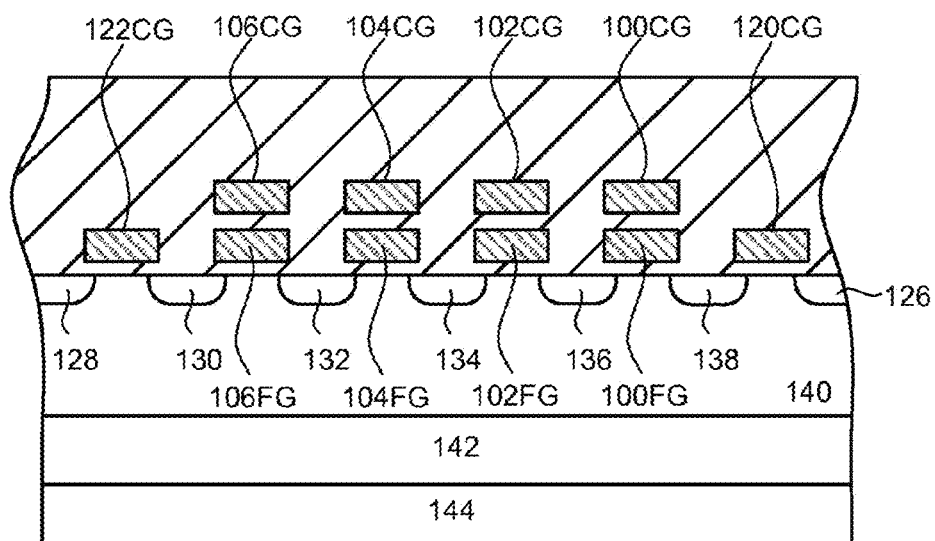
FIG. 2 is a cross-sectional view of the NAND string of FIG. 1A according to aspects of the disclosure.

FIG. 2 provides a cross-sectional view of one embodiment of the NAND string described above. FIG. 2 is for a 2D NAND string formed in a substrate. The transistors of the NAND string are formed in p-well region 140. The p-well region in turn may be within an n-well region 142 of a p-type substrate 144. Each transistor includes a stacked gate structure that consists of a control gate (100CG, 102CG, 104CG and 106CG) and a floating gate (100FG, 102FG, 104FG and 106FG). The floating gates are formed on the surface of the p-well on top of an oxide or other dielectric film. The control gate is above the floating gate, with an inter-polysilicon dielectric layer separating the control gate and floating gate. The control gates of the memory cells (100, 102, 104 and 106) form the word lines. N+ doped layers 130, 132, 134, 136 and 138 are shared between neighboring cells, whereby the cells are connected to one another in series to form a NAND string. These N+ doped layers form the source and drain of each of the cells. For example, N+ doped layer 130 serves as the drain of transistor 122 and the source for transistor 106, N+ doped layer 132 serves as the drain for transistor 106 and the source for transistor 104, N+ doped layer 134 serves as the drain for transistor 104 and the source for transistor 102, N+ doped layer 136 serves as the drain for transistor 102 and the source for transistor 100, and N+ doped layer 138 serves as the drain for transistor 100 and the source for transistor 120. N+ doped layer 126 connects to the bit line for the NAND string, while N+ doped layer 128 connects to a common source line for multiple NAND strings.

Note that although FIGS. 1A-2 show four memory cells in the NAND string, the use of four transistors is provided only as an example. A NAND string used with the technology described herein can have less than four memory cells or more than four memory cells. For example, some NAND strings will include 8, 16, 32, 64 or more memory cells.

Each memory cell can store data represented in analog or digital form. When storing one bit of digital data, the range of possible threshold voltages of the memory cell is divided into two ranges, which are assigned logical data "1" and "0." In one example of a NAND-type flash memory, the voltage threshold is negative after the memory cell is erased, and defined as logic "1." The threshold voltage is positive after a program operation, and defined as logic "0." When the threshold voltage is negative and a read is attempted by applying 0V to the control gate, the memory cell will turn on to indicate logic one is being stored. When the threshold voltage is positive and a read operation is attempted by applying 0V to the control gate, the memory cell will not turn on, which indicates that logic zero is stored.

A memory cell can also store multiple states, thereby storing multiple bits of digital data. When storing multiple states of data, the threshold voltage window is divided into the number of states. For example, if four states are used, there will be four threshold voltage ranges assigned to the data values "11," "10," "01," and "00." In one example of a NAND-type memory, the threshold voltage after an erase operation is negative and defined as "11." Positive threshold voltages are used for the states of "10," "01," and "00." In some implementations, the data values (e.g., logical states) are assigned to the threshold ranges using a Gray code assignment so that if the threshold voltage of a floating gate erroneously shifts to its neighboring physical state, only one bit will be affected. The specific relationship between the data programmed into the memory cell and the threshold voltage ranges of the cell depends upon the data encoding scheme adopted for the memory cells.

Other types of non-volatile memory in addition to NAND flash memory can also be used with the present technology.

Another type of memory cell useful in flash EEPROM systems utilizes a non-conductive dielectric material in place of a conductive floating gate to store charge in a non-volatile manner. A triple layer dielectric formed of silicon oxide, silicon nitride and silicon oxide ("ONO") is sandwiched between a conductive control gate and a surface of a semi-conductive substrate above the memory cell channel. The cell is programmed by injecting electrons from the cell channel into the nitride, where they are trapped and stored in a limited region. This stored charge then changes the threshold voltage of a portion of the channel of the cell in a manner that is detectable. The cell is erased by injecting hot holes into the nitride. A similar cell can be provided in a split-gate configuration where a doped polysilicon gate extends over a portion of the memory cell channel to form a separate select transistor.

In another approach, two bits are stored in each NROM cell, where an ONO dielectric layer extends across the channel between source and drain diffusions. The charge for one data bit is localized in the dielectric layer adjacent to the drain, and the charge for the other data bit localized in the dielectric layer adjacent to the source. Multi-state data storage is obtained by separately reading binary states of the spatially separated charge storage regions within the dielectric.

Figure 3:
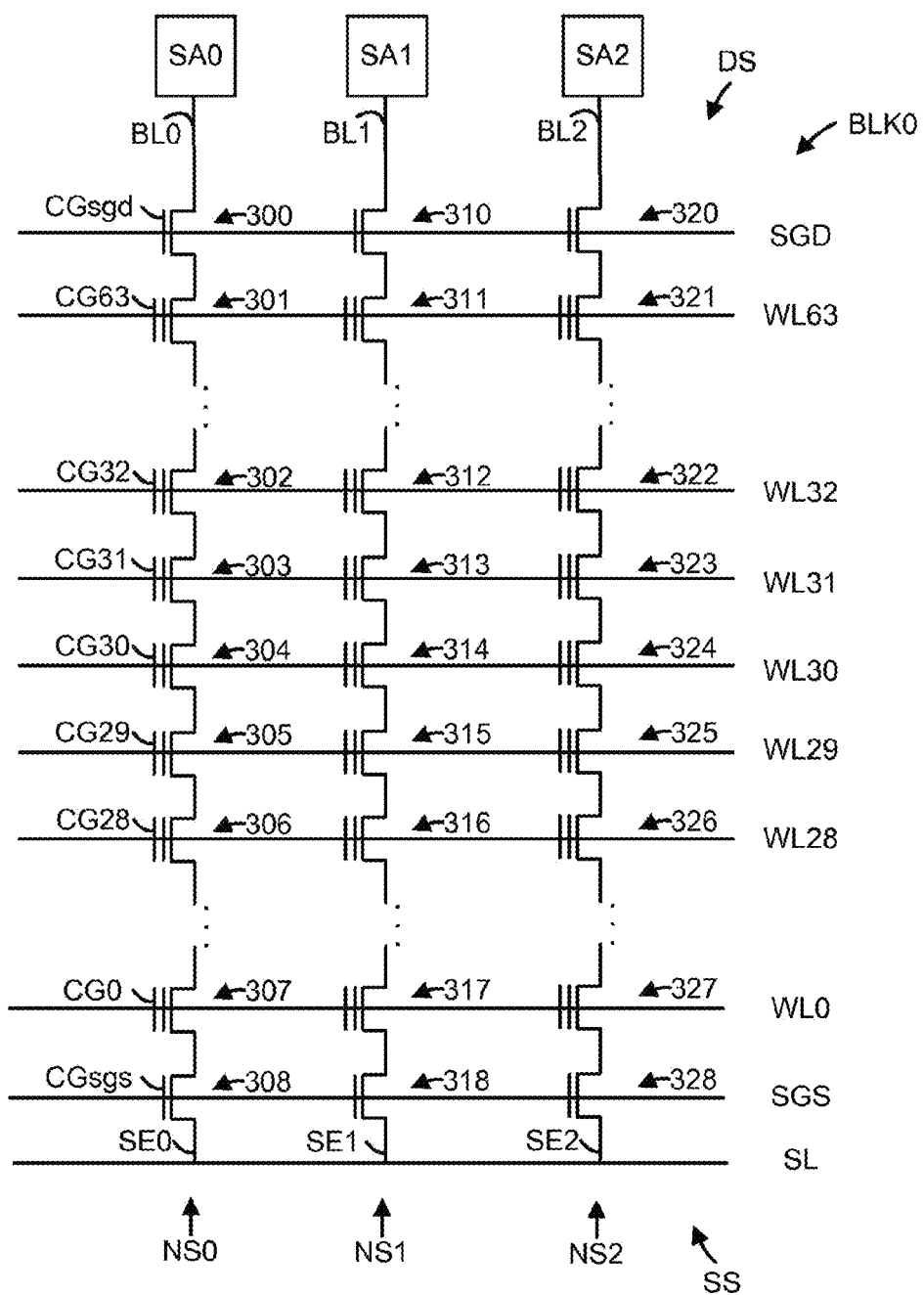
FIG. 3 depicts three example NAND strings such as shown in FIGS. 1A-2 in a block BLK0 according to aspects of the disclosure.

FIG. 3 depicts three example NAND strings such as shown in FIGS. 1A-2 in a block BLK0. BLK0 includes a number of NAND strings NS0, NS1, NS2, ... and respective bit lines, e.g., BL0, BL1, BL2 ... in communication with respective sense amplifiers SA0, SA1, SA2, ... BLK0 comprises a set of non-volatile storage elements. Each NAND string is connected at one end to a select gate, drain (SGD) transistor, and the control gates of the SGD transistors are connected via a common SGD line. The NAND strings are connected at their other end to a select gate, source (SGS) transistor which, in turn, is connected to a common source line (SL). A number of word lines WL0-WL63 extend between the SGS and SGD transistors. WL0 is an edge word line which is adjacent to the source side (SS) of the block and WL63 is an edge word line which is adjacent to the drain side (DS) of the block.

An example NAND string NS0 includes storage elements 301, ..., 302-306, ..., 307 with respective control gates CG63, ... CG32-CG28, ..., CG0, an SGS transistor 308 with a control gate CGsgs and a SGD transistor 300 with a control gate CGsgd. Another example NAND string NS1 includes storage elements 311, ..., 312-316, ..., 317, an SGS transistor 318 and a SGD transistor 310. Another example NAND string NS2 includes storage elements 321, ..., 322-326, ..., 327, an SGS transistor 328 and a SGD transistor 320. The NAND strings NS0, NS2, ... are even numbered, and the NAND strings NS1, NS3 (not shown), ... are odd numbered. Similarly, the bit lines BL0, BL2, ... are even numbered, and the NAND strings BL1, BL3 (not shown), ... are odd numbered. The storage elements can store user data and/or non-user data.

Figure 4:
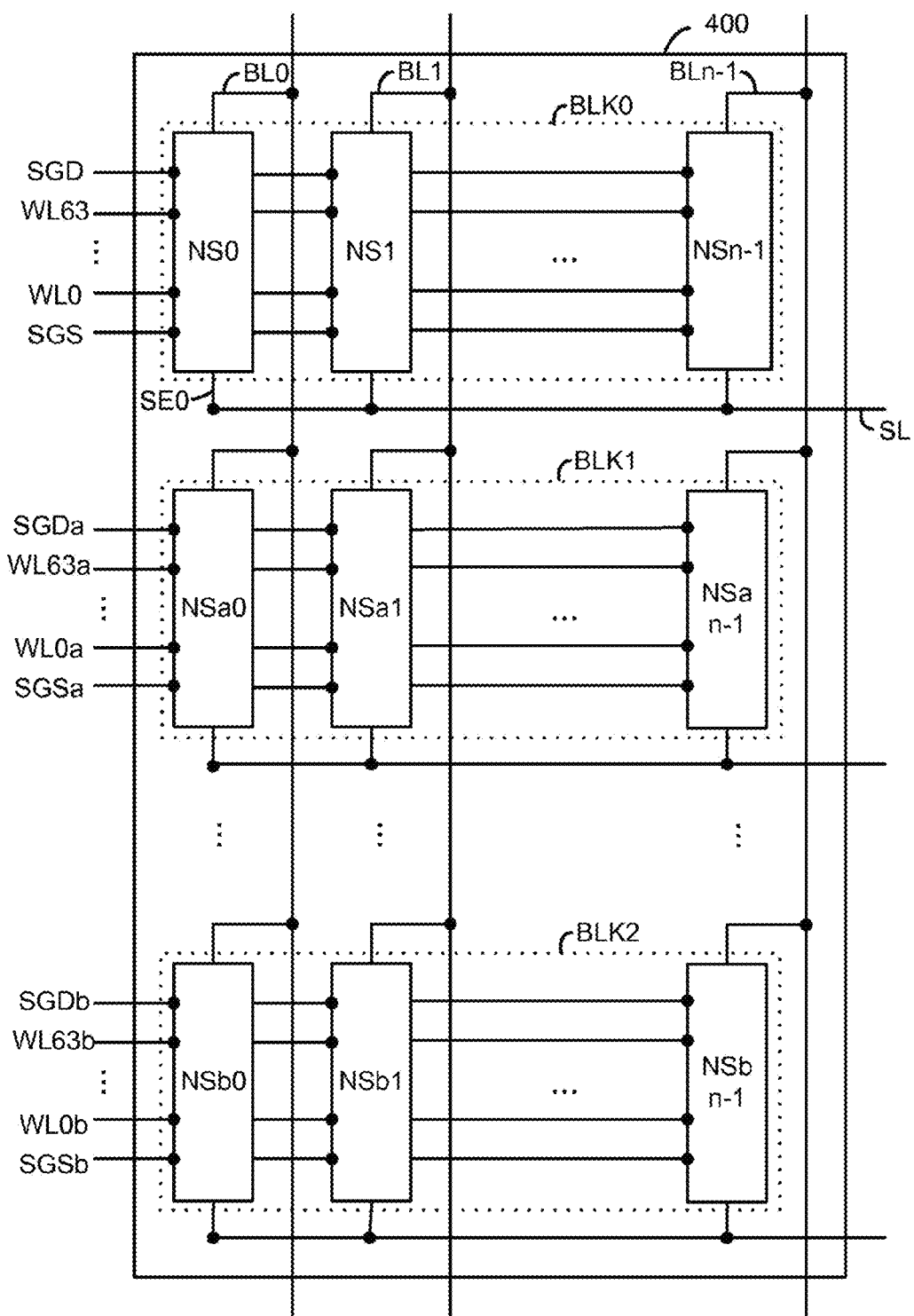
FIG. 4 is a block diagram of an array 400 of NAND flash memory cells including BLK0 of FIG. 3 and additional blocks BLK1 and BLK2 according to aspects of the disclosure.

FIG. 4 is a block diagram of an array 400 of NAND flash memory cells including BLK0 of FIG. 3 and additional blocks BLK1 and BLK2. Along each column, a bit line (BL) is coupled to the drain terminal of the drain select gate for the NAND string. Along each row of NAND strings, a source line (SL) may connect all the source terminals of the source select gates of the NAND strings (e.g., at SE0 of NS0).

The array of storage elements is divided into a large number of blocks (e.g., BLK0-BLK2) of storage elements, where each block includes a set of one or more NAND strings in communication with a common set of word lines, SGS line and SGD line. Each NAND string is also in communication with a respective bit line. For example, BLK0 includes NAND strings NS0, NS1, ..., NSn−1 in communication with BL0, BL1, ... BLn−1, respectively, and with WL0-WL63 SGS and SGD. BLK1 includes NAND strings NSa0, NSa1, ..., NSan−1 in communication with BL0, BL1, ... BLn−1, respectively, and with WL0 a-WL63 a, SGSa and SGDa. BLK2 includes NAND strings NSb0, NSb1, ..., NSbn−1 in communication with BL0, BL1, ... BLn−1, respectively, and with WL0 b-WL63 b, SGSb and SGDb.

As is common for flash EEPROM systems, the block is the unit of erase. That is, each block contains the minimum number of storage elements that are erased together. Each block is typically divided into a number of pages. A page is the smallest unit of programming. One or more pages of data are typically stored in one row of storage elements. For example, a row typically contains several interleaved pages or it may constitute one page. All storage elements of a page will be read or programmed together. Moreover, a page can store user data from one or more sectors. A sector is a logical concept used by the host as a convenient unit of user data; it typically does not contain overhead data, which is confined to the controller. Overhead data may include an Error Correction Code (ECC) that has been calculated from the user data of the sector. A portion of the controller (described below) calculates the ECC when data is being programmed into the array, and also checks it when data is being read from the array. Alternatively, the ECCs and/or other overhead data are stored in different pages, or even different blocks, than the user data to which they pertain.

A sector of user data is typically 512 bytes, corresponding to the size of a sector in magnetic disk drives. Overhead data is typically an additional 16-20 bytes. A large number of pages form a block, anywhere from 8 pages, for example, up to 32, 64 or more pages. In some embodiments, a row of NAND strings comprises a block.

Memory cells are erased in one embodiment by raising the p-well to an erase voltage (e.g., 15-20 V) for a sufficient period of time and grounding or applying a low bias, e.g., 1 V, on the word lines of a selected block while the source and bit lines are floating. Due to capacitive cross coupling ("cross" denotes coupling from neighboring storage elements), the bit lines, select lines, and common source are also raised to a significant fraction of the erase voltage. A strong electric field is thus applied to the tunnel oxide layers of selected memory cells and the data of the selected memory cells are erased as electrons of the floating gates are emitted to the substrate side. As electrons are transferred from the floating gate to the p-well region, the threshold voltage of a selected cell is lowered. Erasing can be performed on the entire memory array, separate blocks, or another unit of cells. In one embodiment, 3D NAND is erased using a different technique. 3D NAND will be further discussed below.

Figure 5A:
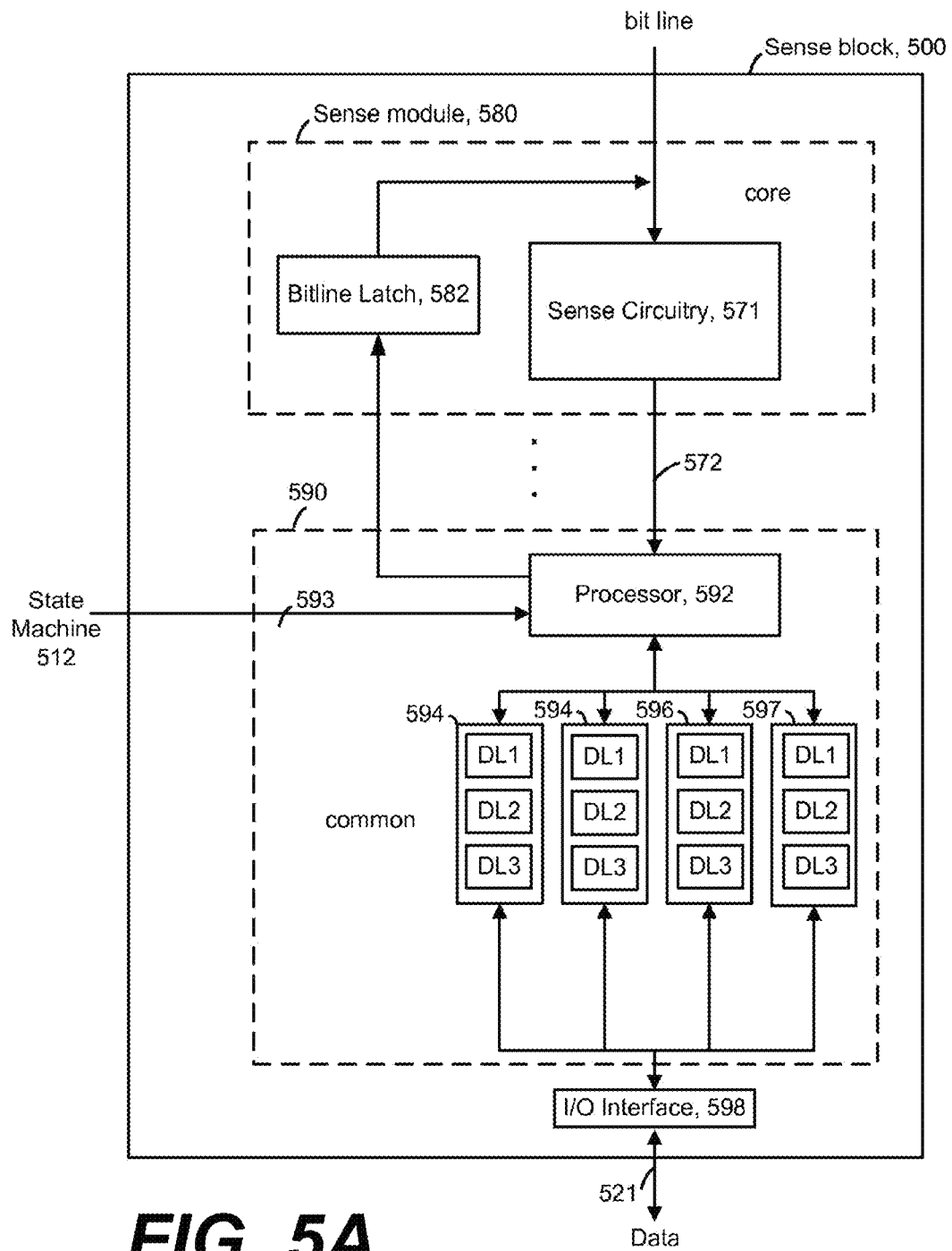
FIG. 5A is a block diagram depicting one embodiment of a sense block according to aspects of the disclosure.

FIG. 5A is a block diagram depicting one embodiment of a sense block 500. An individual sense block 500 is partitioned into a core portion, referred to as a sense module 580, and a common portion 590. In one embodiment, there is a separate sense module 580 for each bit line and one common portion 590 for a set of multiple sense modules 580. In one example, a sense block 500 will include one common portion 590 and eight sense modules 580. Each of the sense modules in a group will communicate with the associated common portion via a data bus 572.

Sense module 580 comprises sense circuitry 571 that determines whether a conduction current in a connected bit line is above or below a predetermined threshold level. Sense module 580 also includes a bit line latch 582 that is used to set a voltage condition on the connected bit line. For example, a predetermined state latched in bit line latch 582 will result in the connected bit line being pulled to a state designating program inhibit (e.g., 1.5-3 V). As an example, a flag=0 can inhibit programming, while flag=1 does not inhibit programming.

Common portion 590 comprises a processor 592, three example sets of data latches 594 and an I/O Interface 598 coupled between the sets of data latches 594 and data bus 521. One set of data latches can be provided for each sense module, and three data latches identified by DL1, DL2, and DL3 may be provided for each set. The use of the data latches is further discussed below.

Processor 592 performs computations. For example, one of its functions is to determine the data stored in the sensed storage element and store the determined data in the set of data latches. At least some of the data latches in a set of data latches (e.g., 594) are used to store data bits determined by processor 592 during a read operation. At least some of the data latches in a set of data latches are also used to store data bits imported from the data bus 521 during a program operation. The imported data bits represent write data meant to be programmed into the memory. I/O interface 598 provides an interface between data latches 594-697 and the data bus 521.

In one embodiment, data is stored in the DL1 and DL2 latches at the beginning of the program operation. For example, lower page data may be stored in DL1 and upper page data may be stored in DL2. In one embodiment, lower page data that is read from memory cells during an IDL is stored in the DL1 latches. DL3 may be used to store verify status, such as lockout status during programming. For example, when a memory cell's Vt has been verified a reaching its target level, the DL3 latch can be set to indicate this such that further programming of the memory cell may be inhibited. Note this describes programming two bits per memory cell. In one embodiment, during a read operation, the DL1 and DL2 latches are used to store the two bits that are read from the memory cell. Note that there may be more than two bits per memory cell. There can be one additional latch for each additional bit to be stored per memory cell.

During reading or other sensing, the state machine 512 controls the supply of different control gate voltages to the addressed storage element. As it steps through the various control gate voltages corresponding to the various memory states supported by the memory, the sense module 580 may trip at one of these voltages and an output will be provided from sense module 580 to processor 592 via bus 572. At that point, processor 592 determines the resultant memory state by consideration of the tripping event(s) of the sense module and the information about the applied control gate voltage from the state machine via input lines 593. It then computes a binary encoding for the memory state and stores the resultant data bits into data latches (e.g., 594). In another embodiment of the core portion, bit line latch 582 serves both as a latch for latching the output of the sense module 580 and as a bit line latch as described above.

Some implementations can include multiple processors 592. In one embodiment, each processor 592 will include an output line (not depicted) such that each of the output lines is wired-OR'd together. In some embodiments, the output lines are inverted prior to being connected to the wired-OR line. This configuration enables a quick determination during the program verification process of when the programming process has completed because the state machine receiving the wired-OR can determine when all bits being programmed have reached the desired level. For example, when each bit has reached its desired level, a logic zero for that bit will be sent to the wired-OR line (or a data one is inverted). When all bits output a data 0 (or a data one inverted), then the state machine knows to terminate the programming process. Because each processor communicates with eight sense modules, the state machine needs to read the wired-OR line eight times, or logic is added to processor 592 to accumulate the results of the associated bit lines such that the state machine need only read the wired-OR line one time. Similarly, by choosing the logic levels correctly, the global state machine can detect when the first bit changes its state and change the algorithms accordingly.

During program or verify, the data to be programmed is stored in the set of data latches 594-597 from the data bus 521. The program operation, under the control of the state machine, comprises a series of programming voltage pulses applied to the control gates of the addressed storage elements. Each program pulse is followed by a read back (verify) to determine if the storage element has been programmed to the desired memory state. Processor 592 monitors the read back memory state relative to the desired memory state. When the two are in agreement, the processor 592 sets the bit line latch 582 so as to cause the bit line to be pulled to a state designating program inhibit. This inhibits the storage element coupled to the bit line from further programming even if program pulses appear on its control gate. In other embodiments, the processor initially loads the bit line latch 582 and the sense circuitry sets it to an inhibit value during the verify process.

Each set of data latch stacks 594-597 contains a stack of data latches corresponding to the sense module 580, in one embodiment. In one embodiment, there are three data latches per sense module 580. All the DL1 and DL2 data latches corresponding to the read/write block of m storage elements can be linked together to form a block shift register so that a block of data can be input or output by serial transfer.

In one embodiment, one purpose of the DL1 and DL2 latches is to store data that is to be programmed into a storage element. For example, the storage elements may store two bits per storage element. In one embodiment, lower page data is initially stored into the DL1 latches and upper page data is initially stored into the DL2 latches.

In one embodiment, the storage elements store three bits per storage element. In this case, there may be an additional data latch (not depicted in FIG. 5A) for initially storing the third bit of data that is to be programmed into a storage element. In one embodiment, the storage elements four bits per storage element, in which there may be two additional data latches (not depicted in FIG. 5A) for initially storing the third and fourth bits of data that is to be programmed into a storage element. The storage elements could store more than four bits per storage element, in which case there may be one data latch for each bit.

Additional information about the read operations and sense amplifiers can be found in (1) U.S. Pat. No. 7,196,931, "Non-Volatile Memory and Method with Reduced Source Line Bias Errors,"; (2) U.S. Pat. No. 7,023,736, "Non-Volatile Memory and Method with Improved Sensing,"; (3) U.S. Pat. No. 7,046,568, "Memory Sensing Circuit and Method for Low Voltage Operation"; (4) U.S. Pat. No. 7,196,928, "Compensating for Coupling during Read Operations of Non-Volatile Memory," and (5) U.S. Pat. No. 7,327,619, "Reference Sense Amplifier for Non-Volatile Memory". All five of the immediately above-listed patent documents are incorporated herein by reference in their entirety.

Figure 5B:
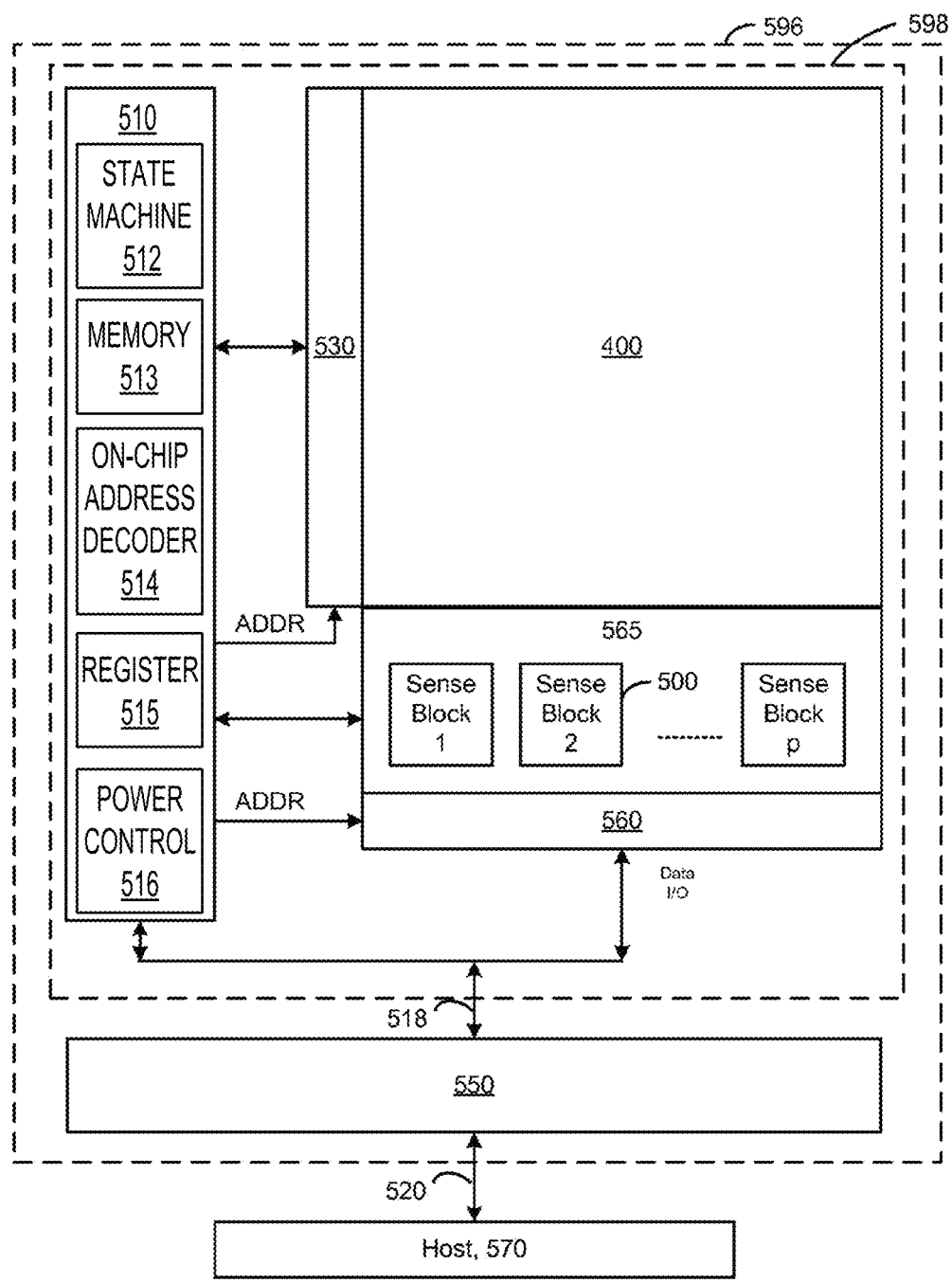
FIG. 5B is a block diagram of a non-volatile memory system which includes the array 400 of FIG. 4 according to aspects of the disclosure.

FIG. 5B is a block diagram of a non-volatile memory system which includes the array 400 of FIG. 4. The memory array 400 could include a 2D architecture or a 3D architecture. One example of a 3D architecture is a BiCS architecture. A 3D architecture may include 3D vertical NAND strings. The memory cells in 3D vertical NAND strings may include an ONO layer to store information. The information may be stored in a charge trapping layer such as, but not limited to, SiN. Note that an ONO layer can be used to store information for both 2D and 2D NAND, as well as other architectures. Thus, a floating gate may be used to store information, but is not required.

The non-volatile memory system comprises a memory device 596 having read/write circuits for reading and programming a page of memory cells in parallel, according to one embodiment of the present technology. Memory device 596 may include one or more memory die 598. Memory die 598 includes a two-dimensional array of memory cells 400, control circuitry 510, and read/write circuits 565. The memory array 400 is addressable by word lines via a row decoder 530 and by bit lines via a column decoder 560. The read/write circuits 565 include multiple sense blocks 500 and allow a page of memory cells to be read or programmed in parallel. Typically a controller 550 is included in the same memory device 596 (e.g., a removable storage card) as the one or more memory die 598. Commands and Data are transferred between the host 570 and controller 550 via lines 520 and between the controller and the one or more memory die 598 via lines 518.

The control circuitry 510 cooperates with the read/write circuits 565 to perform memory operations on the memory array 400. The control circuitry 510 includes a state machine 512, a memory 513, an on-chip address decoder 514, a register 515 and a power control module 516. The state machine 512 provides chip-level control of memory operations. The memory 513 can store original write data, modified write data and status bits for use by the state machine 512. The on-chip address decoder 514 provides an address interface between that used by the host or a memory controller to the hardware address used by the decoders 530 and 560. The register 515 can be used to record voltages used when programming or erasing the memory device 596. The power control module 516 controls the power and voltages supplied to the word lines and bit lines during memory operations. In another approach, dual row/column decoders and read/write circuits are used. A control circuit can be considered to comprise one or more of the components 510, 512, 513, 514, 515, 516, 530, 550, 560, 565, for instance.

Figure 6:
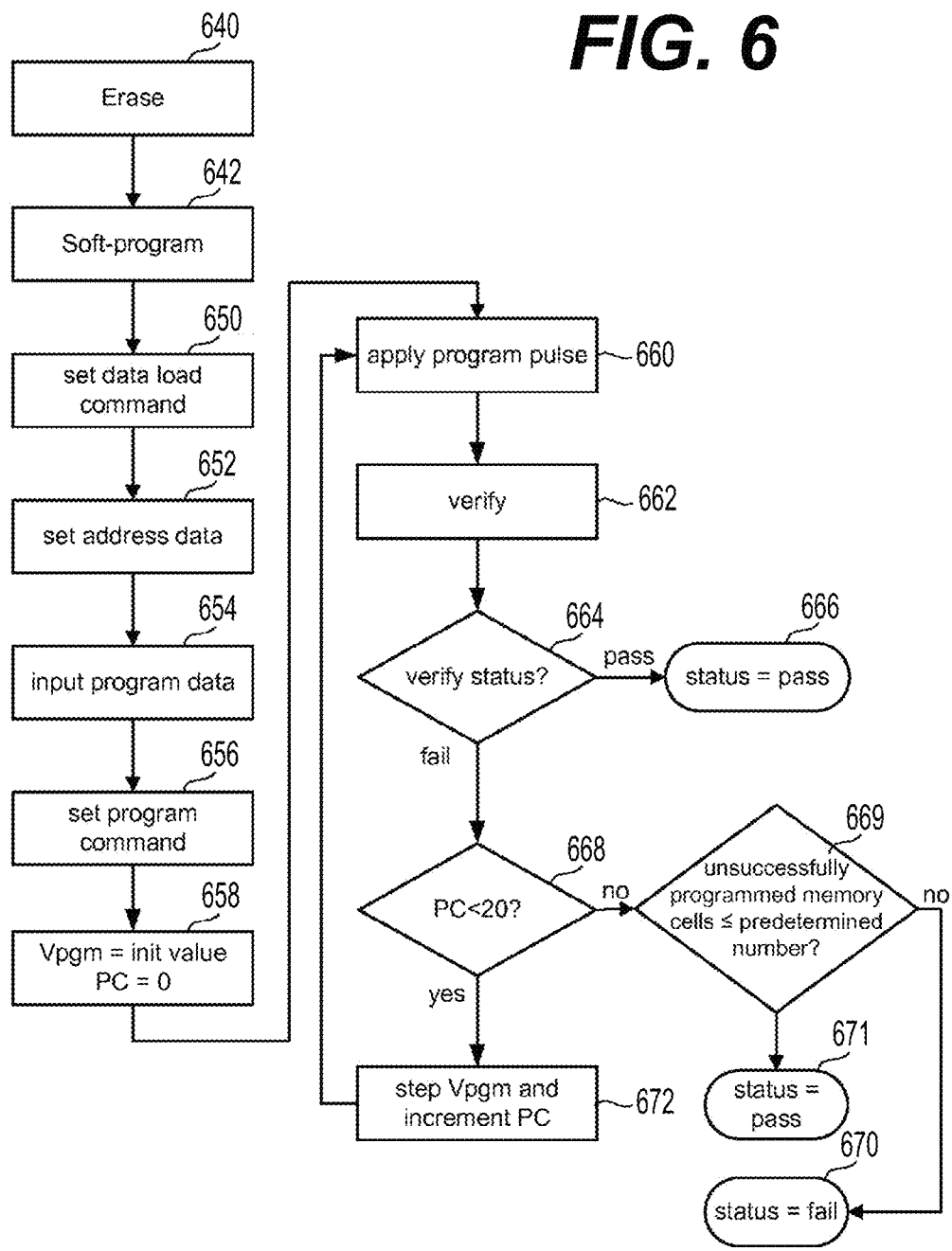
FIG. 6 is a flow chart describing one embodiment of a method for programming non-volatile memory according to aspects of the disclosure.
Figure 8:
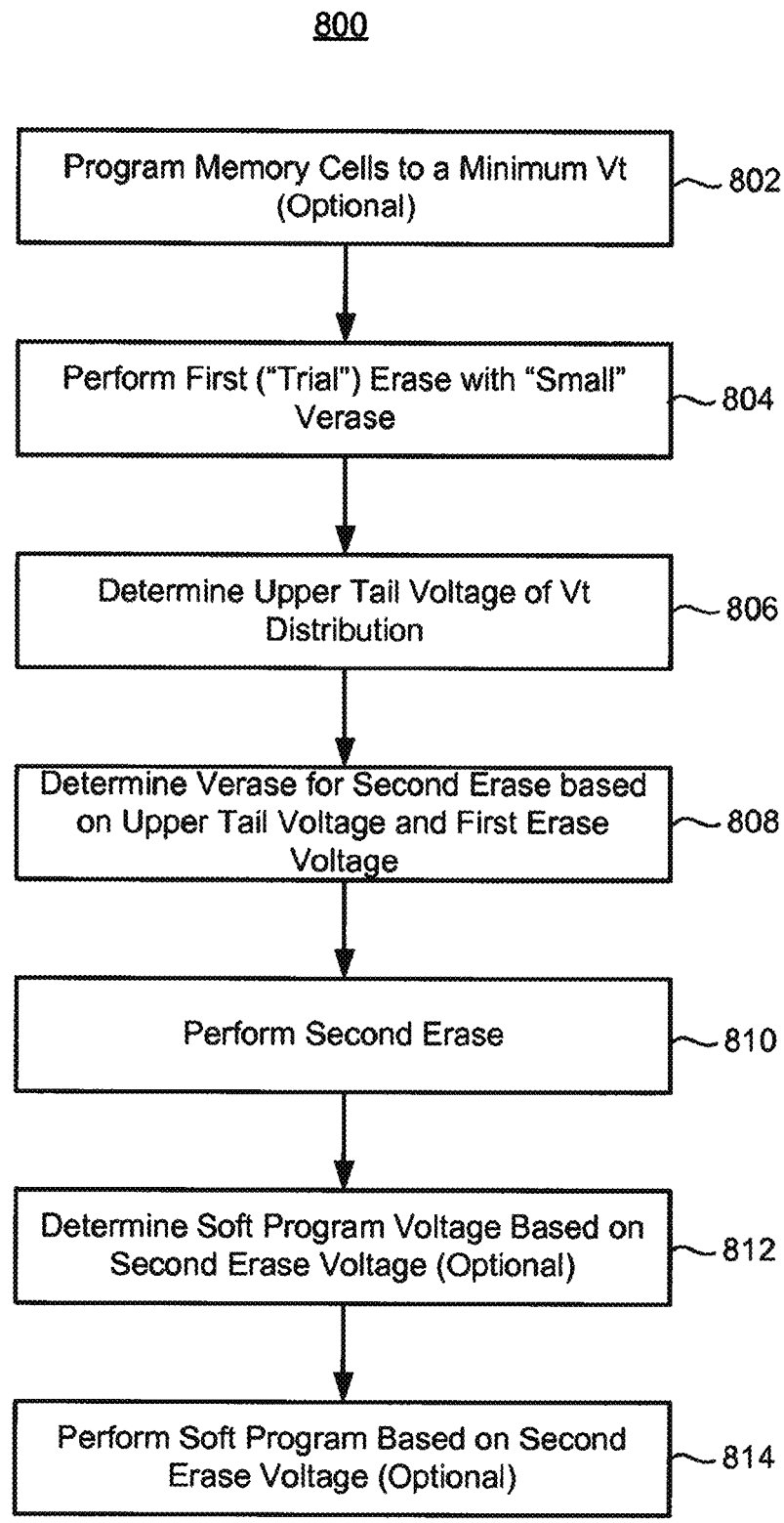
FIG. 8 is a flow chart describing one embodiment of a method for erasing memory cells according to aspects of the disclosure.

FIG. 6 is a flow chart describing one embodiment of a method for programming non-volatile memory. The memory cells to be programmed are erased at step 640. Step 640 can include erasing more memory cells than those to be programmed (e.g., in blocks or other units). FIG. 8 depicts one embodiment of erasing memory cells. At step 642, soft-programming is performed to narrow the distribution of erased threshold voltages for the erased memory cells. Some memory cells may be in a deeper erased state than necessary as a result of the erase process. Soft-programming can apply small programming pulses to move the threshold voltage of the erased memory cells closer to the erase verify level. At step 650 of FIG. 6, a "data load" command is issued by controller 550 and input to command circuits, allowing data to be input to data input/output buffer. At step 652, address data designating the page address is input to row controller or decoder 514 from the controller or host. The input data is recognized as the page address and latched via state machine 512, affected by the address latch signal input to command circuits. At step 654, a page of program data for the addressed page is input to data input/output buffer for programming. For example, 512 bytes of data could be input in one embodiment. That data is latched in the appropriate registers for the selected bit lines. In some embodiments, the data is also latched in a second register for the selected bit lines to be used for verify operations. At step 656, a "program" command is issued by the controller and input to data input/output buffer. The command is latched by state machine 512 via the command latch signal input to command circuits.

Triggered by the "program" command, the data latched in step 654 will be programmed into the selected memory cells controlled by state machine 512 using stepped pulses applied to the appropriate word line. At step 658, Vpgm or VPGM, the programming pulse voltage level applied to the selected word line, is initialized to the starting pulse (e.g., 12V) and a program counter PC maintained by state machine 512 is initialized at 0. At step 660, the first Vpgm pulse is applied to the selected word line. If logic "0" is stored in a particular data latch indicating that the corresponding memory cell should be programmed, then the corresponding bit line is grounded. On the other hand, if logic "1" is stored in the particular latch indicating that the corresponding memory cell should remain in its current data state, then the corresponding bit line is connected to VDD to inhibit programming.

At step 662, the states of the selected memory cells are verified. If it is detected that the target threshold voltage of a selected cell has reached the appropriate level, then the data stored in the corresponding data latch is changed to a logic "1." If it is detected that the threshold voltage has not reached the appropriate level, the data stored in the corresponding data latch is not changed. In this manner, a bit line having a logic "1" stored in its corresponding data latch does not need to be programmed. When all of the data latches are storing logic "1," the state machine knows that all selected cells have been programmed. At step 664, it is checked whether all of the data latches are storing logic "1." If so, the programming process is complete and successful because all selected memory cells were programmed and verified to their target states. A status of "PASS" is reported at step 666.

If, at step 664, it is determined that not all of the data latches are storing logic "1," then the programming process continues. At step 668, the program counter PC is checked against a program limit value. One example of a program limit value is 20, however, other values can be used in various implementations. If the program counter PC is not less than 20, then it is determined at step 669 whether the number of bits that have not been successfully programmed is equal to or less than a predetermined number. If the number of unsuccessfully programmed bits is equal to or less than the predetermined number, then the programming process is flagged as passed and a status of pass is reported at step 671. The bits that are not successfully programmed can be corrected using error correction during the read process. If however, the number of unsuccessfully programmed bits is greater than the predetermined number, the program process is flagged as failed and a status of fail is reported at step 670. If the program counter PC is less than 20, then the Vpgm level is increased by the step size and the program counter PC is incremented at step 672. After step 672, the process loops back to step 760 to apply the next Vpgm pulse.

The flowchart of FIG. 6 depicts a single-pass programming method as can be applied for binary storage. In a two-pass programming method as can be applied for multi-level storage, for example, multiple programming or verification steps may be used in a single iteration of the flowchart. Steps 658-672 may be performed for each pass of the programming operation. In a first pass, one or more program pulses may be applied and the results thereof verified to determine if a cell is in the appropriate intermediate state. In a second pass, one or more program pulses may be applied and the results thereof verified to determine if the cell is in the appropriate final state.

At the end of a successful program process, the threshold voltages of the memory cells should be within one or more distributions of threshold voltages for programmed memory cells or within a distribution of threshold voltages for erased memory cells.

Figure 7:
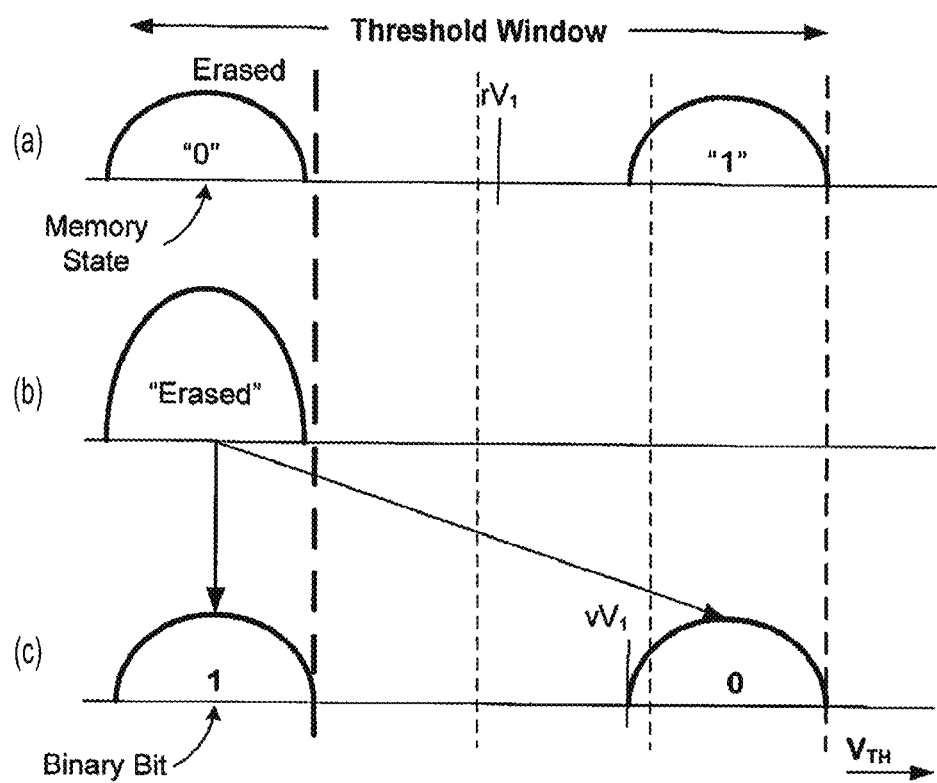
FIG. 7 illustrates a binary memory having a population of cells with each cell being in one of two possible states according to aspects of the disclosure.

FIG. 7 illustrates a binary memory having a population of cells with each cell being in one of two possible states. Each memory cell has its threshold window partitioned by a single demarcation level into two distinct zones. As shown in FIG. 7(*a*), during read, a read demarcation level rV1, between a lower zone and an upper zone, is used to determine to which zone the threshold level of the cell lies. The cell is in an "erased" state if its threshold is located in the lower zone and is in a "programmed" state if its threshold is located in the upper zone. FIG. 7(*b*) illustrates the memory initially has all its cells in the "erased" state. FIG. 7(*c*) illustrates some of cells being programmed to the "programmed" state. A 1-bit or binary code is used to code the memory states. For example, the bit value "1" represents the "erased" state and "0" represents the "programmed" state. Typically programming is performed by application of one or more programming voltage pulse. After each pulse, the cell is sensed to verify if the threshold has moved beyond a verify demarcation level vV1. A memory with such memory cell partitioning is referred to as "binary" memory or Single-level Cell ("SLC") memory. It will be seen that a binary or SLC memory operates with a wide margin of error as the entire threshold window is only occupied by two zones.

FIG. 8 depicts one embodiment of a process 800 of erasing memory cells. The process 800 of FIG. 8 is one technique for implementing step 640 in FIG. 6. In optional step 802, memory cells are programmed to some minimum threshold voltage. As an example, substantially all of the memory cells are programmed to a Vt of at least one volt above the measureable Vt window (common range of threshold voltages). The measurable Vt window is the range of Vts that are used to store valid data on the particular memory device. The bottom of the window varies depending upon factors such as whether or not negative Vt sensing is employed. In an implementation that does not use negative sensing of Vts, the beginning of the measurable Vt window is approximately 0V. In an implementation that uses negative sensing, the beginning of the measurable Vt window can go almost as negative as to −Vdd. For example, using negative sensing, the beginning of the measurable Vt window is approximately −1.6 V with a Vdd of 2.2V. Negative sensing is performed as follows, in one implementation. The source and the Pwell are held at 1.6 V. The drain is held at 1.6 V+Vb1, where Vb1 is the voltage to which the bit line is pre-charged. As an example, Vb1 is 0.4 V. In this type of negative sensing, there is no body effect as the source and Pwell are held at the same voltage. In one embodiment, negative Vt sensing is performed by applying a negative voltage to the control gates.

One reason for performing step 802 is to pre-condition the memory cells prior to a trial erase or first erase pulse to allow more accurate determination of a reference point on the threshold distribution after the trial erase. In one implementation, the reference point is referred to herein as the "upper tail Vt," as the reference point is typically on the very upper end of the Vt distribution. Later steps of process 800 determine counts based on how many memory cells have Vts above read reference voltages that are applied to the memory cells after a trial erase has been performed. In one implementation, the counts are made on a NAND string basis. That is, if one or more memory cells in a NAND string satisfy a condition, then the NAND string is counted. However, counting does not have to be performed on a NAND string basis. After applying the pulse of step 802, the lowest Vt of substantially all of the memory cells should be above the read reference voltages to ensure that memory cells that are later counted will be memory cells that were erased by the trial erase pulse.

In step 804, a trial or first erase of the memory cells is performed. In one embodiment, the magnitude of the trial erase voltage is sufficiently low to ensure that a the upper portion of the erase distribution is in the measurable Vt window such that certain read reference voltages can be applied to the memory cells to determine how many memory cells have Vts above the read reference voltages. Note that a portion of the Vt distribution may be below the lowest measurable Vt, so long as the upper portion is in the measureable Vt window. Later steps of process 800 will apply read voltages and determine counts of how many NAND strings have Vts above the read voltages. The upper tail Vt will be determined based on those counts.

Note that it becomes harder to erase some memory devices over time. Therefore, characteristics (e.g., magnitude) of the trial erase pulse may be a function of memory device usage (e.g., erase/program cycles). For some devices, the increase in difficulty in erasing memory cells may be approximately logarithmic. Thus, the adjustment to the trial erase pulse may be made at 100 cycles, 1K cycles, 10K cycles, for example. In some embodiments, the number of erase/program cycles are tracked and the trial erase pulse is adjusted based thereon. Tracking may be on a block-by-block basis, but this is not required. Note that due to wear leveling procedures, it may be possible, at any given time during the life of the product, to use the same trial erase pulse for all blocks in a given device as it may be assumed a similar level of wear in each block.

The upper tail Vt is a point near the upper end of the Vt distribution. The upper tail Vt may be defined based on ignoring a certain number of outlying Vts. For example, about 31 memory cells have Vts to the right of the upper tail Vt. The upper tail Vt can be defined based on any number other than 31. If counting is performed on a NAND string basis, then a certain number of NAND strings are ignored. As an example, NAND strings are examined to determine whether a given NAND string has at least one memory cell with a Vt above a read reference voltage. The read reference voltage is adjusted until about 31 of the NAND strings have at least one memory cell with a Vt above the read reference voltage. Thus, about 31 NAND strings have at least one memory cell with a Vt above the upper tail Vt. Note that there may be about 75,000 NAND strings in the block. The upper tail Vt may also be defined based on statistics. For example, if the Vt distribution is characterized by a mean and a standard deviation, then the upper tail Vt may be defined as a certain real number of standard deviations above the mean.

In one embodiment, the trial erase is achieved by raising the p-well to an erase voltage for a sufficient period of time and grounding the word lines of a selected block while the source and bit lines are floating. Due to capacitive coupling, the unselected word lines, bit lines, select lines, and the common source line are also raised to a significant fraction of the erase voltage. A strong electric field is thus applied to the tunnel oxide layers of selected memory cells and the data of the selected memory cells are erased as electrons of the floating gates are emitted to the substrate side, typically by Fowler-Nordheim tunneling mechanism. As electrons are transferred from the floating gate to the p-well region, the Vt of a selected cell is lowered. Erasing can be performed on the entire memory array, on individual blocks, or another unit of cells.

In step 806, an upper tail Vt is determined at some bit level of interest. The bit level of interest refers to how many Vts are ignored. For example, because there can be expected to be a number of outlying Vts in a Vt distribution, a certain number of the outliers can be ignored. As previously discussed, a single Vt can be determined for an entire NAND string. Thus, in one implementation, the bit level of interest refers to how many NAND strings are allowed to have at least one memory cell with a Vt above the upper tail Vt. The upper tail Vt serves as a reference point for later calculations.

In one implementation, the bit level of interest is based on the number of NAND strings that the memory device 596 "ignores" during an erase verify. That is, even if a certain number of NAND strings have one or more memory cells with a Vt greater than the target level, the erase verify passes. As an example, the memory device 596 might allow 31 NAND strings in each block to have one or more memory cells with a Vt above the target level. Typically, the device performs the erase verify on a NAND string basis. That is, an erase verify voltage is applied to each word line in the block. Each memory cell in a given NAND string should turn on for the erase verify to pass. In one embodiment, the erase verify passes provided that no more than a certain number of NAND strings fail verification. While it is possible to examine the Vts of individual memory cells in those NAND strings that failed verification to determine whether multiple memory cells caused the verification to fail, this is not required. Note that having a certain number of memory cells with Vts above the target level does not present a data integrity problem because ECC can correct these values. That is, if a later read operation finds that some of the memory cells are actually in a higher state, ECC will correct the problem. However, other techniques can be used to determine the upper tail Vt. Further details of determining the upper tail Vt are discussed below with reference to FIGS. 9A, 9B, 9C, and 9D.

In step 808, a second erase voltage is determined based on the trial erase voltage and the upper tail Vt. In one embodiment, the second erase voltage (VE2) is determined based on the following equations.

$$VE2=VE1+(VU1/S)+M \qquad \text{Eq. 1}$$

$$S=\Delta VT/\Delta VE \qquad \text{Eq. 2}$$

In Equation 1, VE1 is the trial erase voltage from step 804, and VU1 is the upper tail Vt that was determined in step 806. The parameter "S" is based on how responsive the memory cells are to erase voltages. That is, S is based on how far the upper tail Vt is expected to shift per unit increase in erase voltage. Equation 2 defines S as the shift of the upper tail Vt per 1 V increase in erase voltage. In one implementation, the parameter S is calculated based on tests of a sample memory device and may be used for all similar memory devices. Thus, no determination of S is needed in the field. However, S can be determined or modified in the field. Furthermore, a different value of S could be used for different memory devices having the same design. For example, S can be fine-tuned to account for semiconductor process variations in different batches of memory devices. The parameter S might even be fine-tuned for each memory device. For example, when the memory device is manufactured a test may be performed to determine how susceptible memory cells on that particular memory device are to erase pulses. A value for S may be programmed into the particular memory device based on the test results.

Note that there may be some variation in how susceptible memory cells are to erase voltages. This variation may be memory cell to memory cell, block to block, memory die to memory die, lot to lot, etc. The parameter "M" in Equation 1 is a margin number to ensure that the second erase is strong enough to account for possible variations. The value of M is selected to ensure that those memory cells that are less susceptible to erase voltages will be sufficiently erased. It may be that some memory cells will be over-erased to a small extent. For example, memory cells that are more susceptible to erase voltages than average may be over-erased. However, having some memory cells over erased is acceptable.

Note that just as with the parameter S, the parameter M may be fine-tuned on a device by device basis, on a batch by batch basis, etc. Furthermore, while the parameter M may be programmed into the memory device at manufacture, a suitable value for M can be determined in the field. Also, the value that was programmed into the device at manufacture can be fined tuned in the field.

Furthermore, note that the actual determination of the second erase voltage may be performed by either calculation or a table lookup. For example, in one implementation the input to the table is the upper tail voltage and the trial erase voltage. The output of the table is the second erase voltage.

In step 810, a second erase is performed using the erase voltage that was determined in step 808. In one embodiment, the second erase is achieved by raising the p-well to an erase voltage for a sufficient period of time and grounding the word lines of a selected block while the source and bit lines are floating. In one embodiment, the erase is completed at this point with no erase verify operation. Thus, the second erase may be completed with a single erase pulse. Verifying the erase threshold distribution is not a requirement. However, an erase verify may optionally be performed. Note that if an erase verify operation is performed, it may be necessary to sense a negative Vt. However, in implementations in which the final erase Vt distribution is not verified, there is no need to perform negative Vt sensing.

After the erase is performed, it is possible that some of the memory cells may be in a deeper erased state than necessary. Soft programming, which is a small programming pulse, can be used to nudge the Vt of some of the erased memory cells upwards. In particular, soft programming nudges the Vts of the most deeply erased memory cells such that the erase threshold distribution is compacted.

In optional step 812, a soft program voltage is determined based on the second erase voltage. There exists a correlation between the voltage needed to erase memory cells and the voltage need to program those memory cells as a block is cycled. In some implementations, erase becomes harder and programming becomes easier with more program/erase cycles. Therefore, knowledge of the value of the erase voltage that was required to erase the block to a deep enough level allows the calculation of the correct value of the soft program pulse that can tighten the erase distribution. In one implementation the soft programming voltage is determined based on the following equation:

$$Vsp = Vref - Ve2 * K \qquad \text{Eq. 3}$$

In Equation 3, Ve2 is the magnitude of the second erase voltage. The parameter Vref is a reference voltage and K is a constant. Suitable values for Vref and K may be determined based on tests performed on sample devices. In one embodiment, the soft program voltage is determined by applying an equation such as Equation 3. In one embodiment, a lookup table is used to obtain the value of the soft program pulse, based on the second erase voltage.

Note that if the soft program pulse is too weak it will not help to tighten the erase distribution and if the soft program pulse is too strong it can program the memory cells out of the erased state and into one or more of the programmed states. However, a soft program pulse with the proper amplitude will tighten the erase distribution. A possible reason for the foregoing is that memory cells with higher coupling ratios are both easier to erase and easier to program than cells with lower coupling ratios. Cells with higher coupling ratios will end up at the lower portion of the erase distribution after an erase pulse. A soft programming pulse with the proper amplitude will nudge the Vts of these cells before the rest of the memory cells start to program, thereby tightening the erase distribution. But if the soft programming pulse is too strong, then all the memory cells will start to program, and the tightening effect is lost.

In optional step 814, the soft program voltage is used to compact the erase threshold distribution. In some implementations, there is no verification of the soft programming. Because there is no verification, only a single soft program pulse is applied. However, verification of the soft programming can be performed.

In one embodiment, fresh blocks with a low cycle count are erased using a single erase pulse without using process 800 of FIG. 8. After erasing becomes more difficult and a single pulse is no longer sufficient to erase the block, the process 800 of FIG. 8 is used.

Figure 9A:
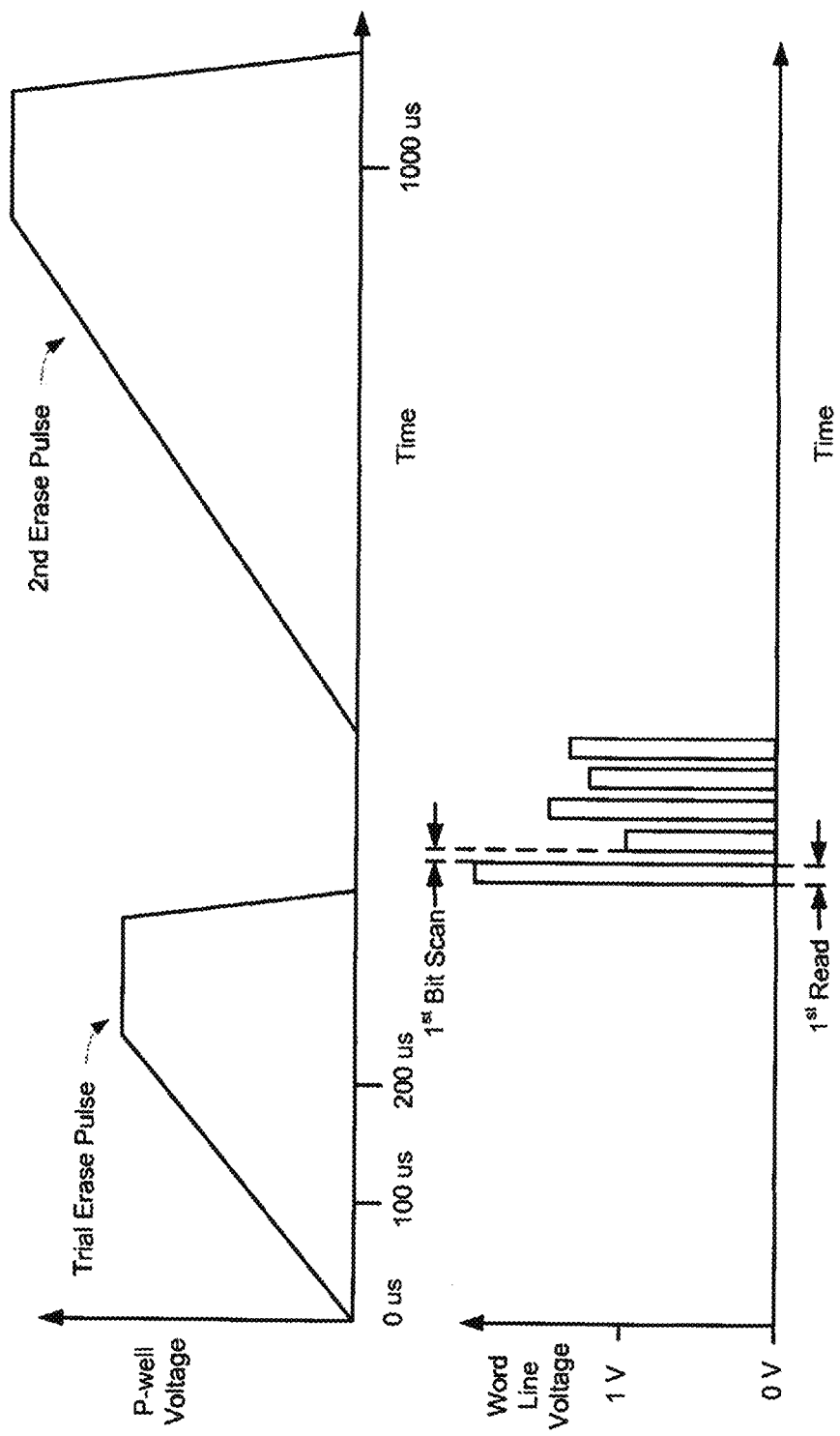
FIG. 9A depicts a graph of P-well voltage versus time and a graph of word line voltage versus time.

FIG. 9A depicts a graph of P-well voltage versus time and a graph of word line voltage versus time. The graph of P-well voltage depicts two different erase voltage pulses that are applied to the P-wells to erase the memory cells. The other graph depicts the voltages applied to the word lines during a scan to seek the upper tail Vt. Briefly, the graphs depict applying a trial erase pulse followed by performing a binary search for the upper tail Vt. The binary search involves applying a first read voltage to the word lines followed by a bit scan operation in which a count is made based on how many of the memory cells fail to turn on in response to the read voltage. Based on that count, the read voltage is adjusted up or down and re-applied to the word lines. In one implementation, each read takes about 20 micro-seconds and each bit scan takes about 12 micro-seconds. The upper tail Vt is determined based on results of the binary search. The second erase pulse is determined based on the upper tail Vt. The second erase voltage is then applied to the P-wells of the memory cells.

Figure 9B:
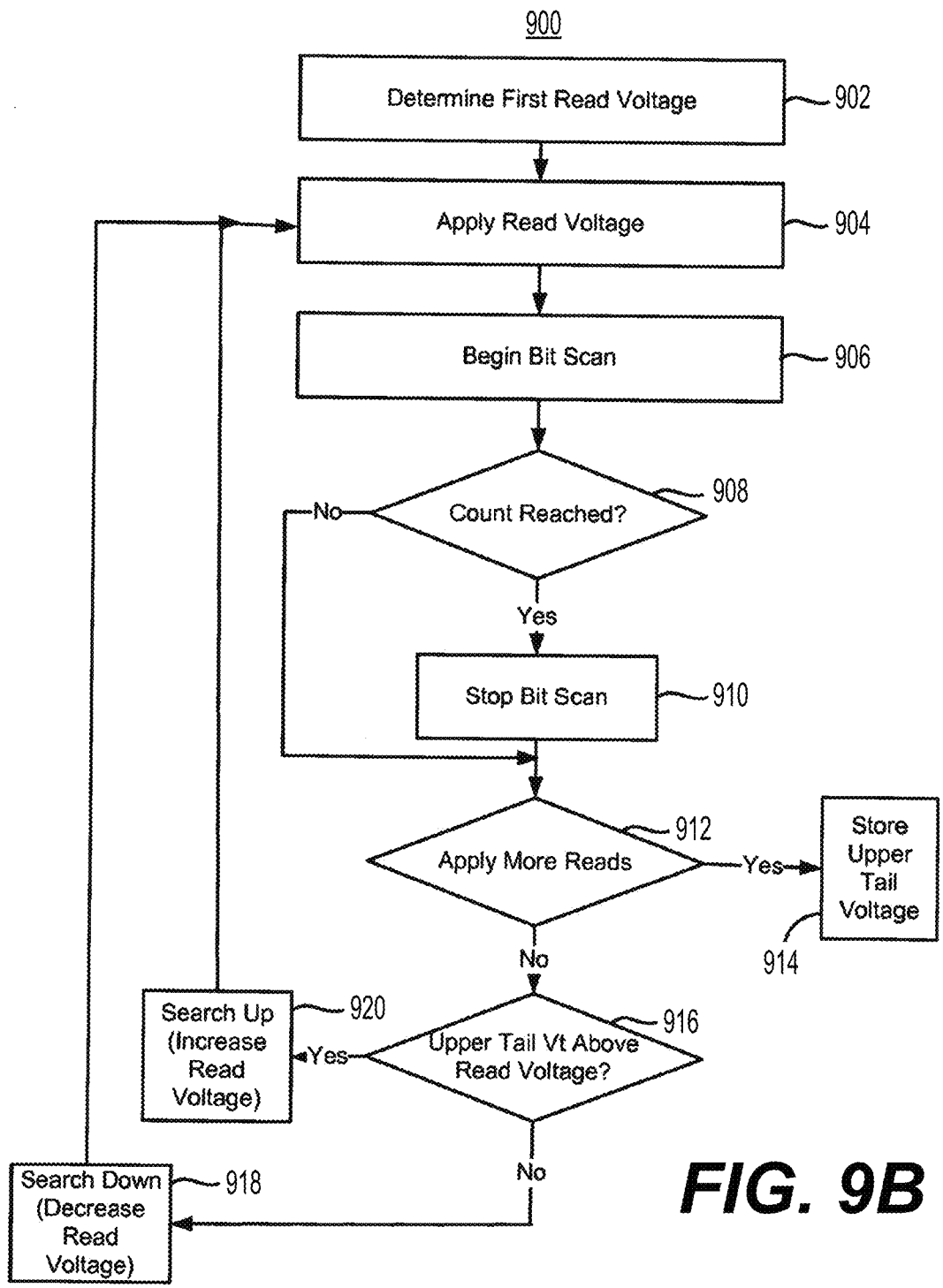
FIG. 9B depicts one embodiment of a process of performing a scan of memory cells in a block (or other unit) to determine an upper tail threshold voltage after a trial or first erase pulse according to aspects of the disclosure.

FIG. 9B depicts one embodiment of a process 900 of performing a scan of memory cells in a block (or other unit) to determine an upper tail Vt after a trial erase. Process 900 is one technique for implementing step 806 of FIG. 8. Process 900 will be discussed with reference to FIG. 9A. In particular, the lower graph in FIG. 9A depicts example voltages applied to word lines during a binary search for the upper tail Vt.

In step 902, a first read voltage is determined based on a window in which the binary search will be performed. The window for the binary search is sufficiently wide such that the upper tail Vt is expected to be within the window. In one implementation, the window ranges from 0 to 4 volts. In one implementation, the window ranges from 0 to 6 volts. The window is not required to start at 0 volts, although the window should start at a voltage that is within the measurable Vt window. For example, if negative Vt sensing is used, then the measurable Vt window could start below 0 Volts. In the example depicted in FIG. 9B, the first read voltage is 2 volts based on a window that ranges from 0 to 4 volts.

In step 904, a first read voltage is applied to the word lines of the memory cells. The first read voltage may be applied simultaneously to each word line. Thus, the first read is intended to read one condition for each entire NAND string, as opposed to a condition of each memory cell on a NAND string. However, it is not required that the first read voltage be applied simultaneously to each word line. Thus, each memory cell could be read individually.

In step 906, a bit scan begins to count how many of the NAND strings have one or more memory cells with a Vt above the read voltage. The bit scan determines how many of the NAND strings have at least one memory cell that fail to turn on in response to the first read voltage. In one embodiment, the bit scan stops once a certain count is reached. For example, if the upper tail Vt is defined based on allowing 31 NAND strings to have one or more memory cells with Vts above a certain point, then the count may stop once that level is reached. The count is not required to be performed on a NAND string basis. In FIG. 9B, the time period labeled a "bit scan" refers to the period in which the count is being made.

Another technique for performing the bit scan is to start the search from a point (e.g., central point) and alternate away from that point. The scan continues until a transition is reached. A transition is defined based on how many of the NAND strings fail to turn on. As an example, the transition is based on whether 31 or fewer NAND strings fail to turn on. To illustrate, the following sequence of voltages are applied:

2.0, 2.1, 1.9, 2.2, 1.8, 2.3, 1.7, 2.4, 1.6

Note that each successive voltage is on the opposite side of the starting point. In the above example, a transition occurred when 1.6 volts are applied. Thus, the upper tail is determined to be between 1.6 and 1.7 volts. As a further example, had the transition occurred when 2.4 volts were applied, the upper tail would be between 2.3 and 2.4 volts. Note that, in this embodiment, the central point is selected based on an expectation of where the upper tail is likely to be. Thus, this scan can be very efficient.

In one embodiment, the count is performed "on-chip." Thus, for example, data does not need to be transferred from the memory die 598 to the controller 550 to perform the count. By avoiding this data transfer the count can be performed very rapidly. In one embodiment, counting performed on chip can only reach a limited value. For example, the on chip circuitry may be able to count up to 32, 64, or some other value. After that count is reached, the counter overflows. The count upon which the upper tail Vt is defined may be at the point the counter overflows. However, the upper tail Vt could be defined to be a smaller number.

In one embodiment, the on chip counting is performed in two stages. In the first stage, different groups of NAND strings are examined. A value of either 1 or 0 is determined for each NAND string group based on whether there is at least one memory cell in a given NAND string group having a Vt above the current read voltage. If the NAND string group count goes over the limit, the scan stops. In the second stage, each of the groups that have a value of 1 is examined to determine how many NAND strings have one or more memory cells with a Vt above the current read. If the counter overflows during the second stage, counting stops.

Thus, if the count overflows (step 908), the bit scan is stopped (910). Otherwise, the bit scan continues until all of the NAND strings are read.

In step 912, a determination is made whether another read voltage should be applied. For example, referring to FIG. 9A, five read voltages are applied. The search could use more or fewer iterations to achieve a different resolution. If the upper tail Vt is not found within the search window, then the search window can be expanded and the process 900 repeated. For example, it is possible that the upper tail Vt is above 4 Volts. However, the trial erase voltage of step is selected to place the upper tail Vt distribution in a 4V range that starts from the beginning of the measurable Vt window. A 4 Volt window should be a sufficient range to cover block to block, die to die, wafer to wafer, and lot to lot variations at any cycle point. If the upper tail Vt does fall outside of the 4V window, then the window can be expanded to, for example, 6V.

If there are no more read voltages to apply, then the upper tail Vt is stored, in step 914. Note that since the last two read voltages "straddle" the upper tail Vt, the value that is stored can be either of the last two read voltages or any value between. In one embodiment, the average value of the two values that straddle the upper tail Vt is obtained and used as the upper tail Vt value. If the desired resolution has not yet been reached, then control passes to step 916.

In step 916, a determination is made whether upper tail Vt is above or below the last read voltage. In some embodiments, the count from the bit scan will either be at the maximum value (e.g., 32) or some value less than that. In these embodiments, a count of less than 32 indicates that the upper tail Vt is less than the last read voltage that was applied. Therefore, the read voltage is reduced (e.g., from 2V to 1V). After reducing the read voltage (step 918), control passes to step 904 to apply the new read voltage to the word lines.

On the other hand, if the count was exceeded, then the read voltage is increased (e.g., from 1 V to 1.5 V). After increasing the read voltage (step 920), control passes to step 1104 to apply the new read voltage to the word lines.

Figure 9C:
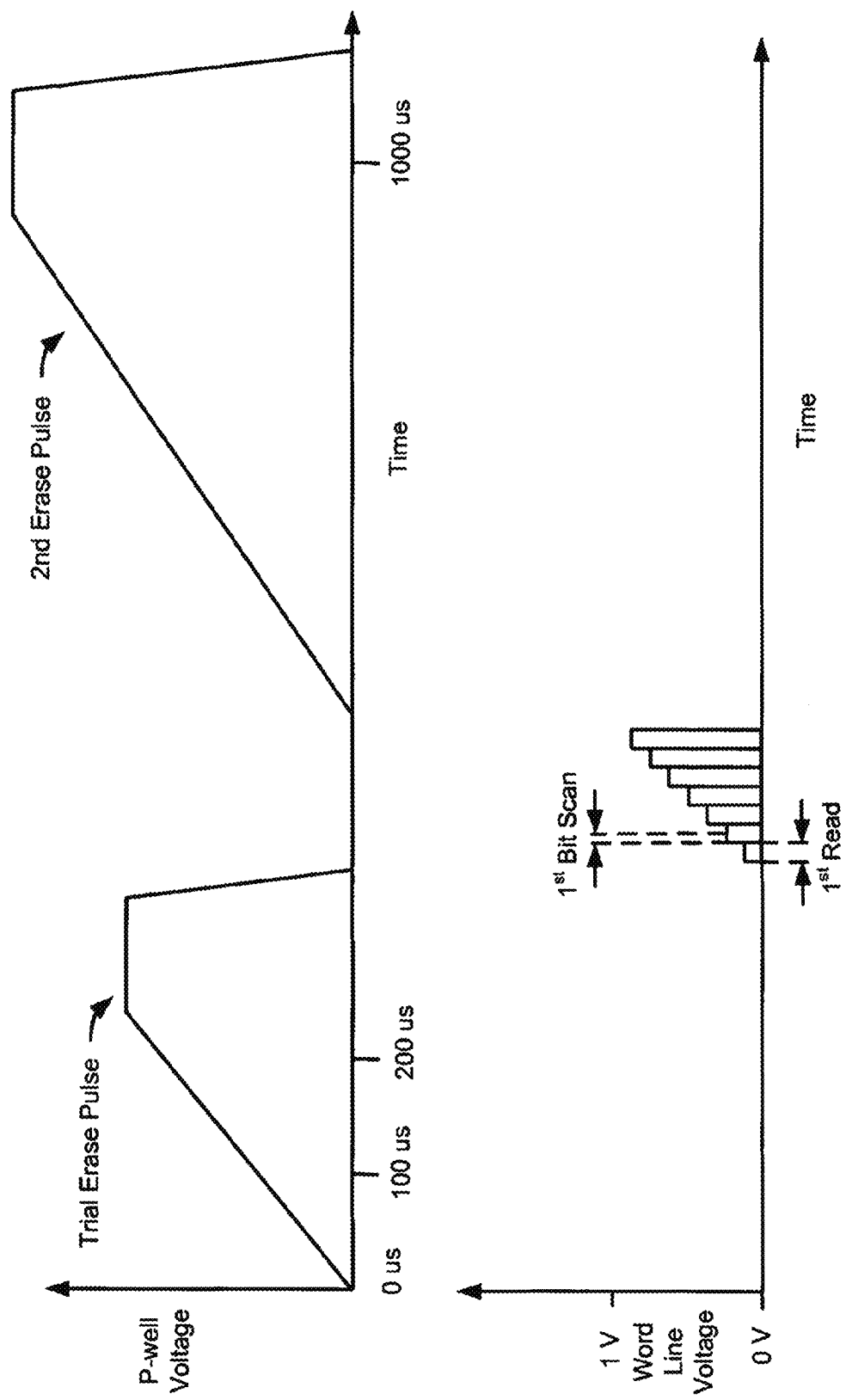
FIG. 9C depicts a graph of P-well voltage versus time for two different erase voltages applied to P-wells associated with memory cells to erase the memory cells and a graph of word line voltages versus time according to aspects of the disclosure.

In one embodiment, a linear search for the upper tail Vt is performed. FIG. 9C depicts P-well voltage for two different erase voltages applied to the P-wells to erase the memory cells and word line voltages applied to the memory cells during a linear scan for the upper tail Vt. Briefly, the trial erase pulse is applied followed by performing a linear search for the upper tail Vt. The second erase voltage is then applied to the P-wells of the memory cells. The linear search involves applying a first read voltage to the word lines followed by a bit scan operation in which a count is made of how many NAND strings have at least one memory cells fail to turn on in response to the read voltage. In the depicted embodiment, the next read voltage is applied prior to determining the count. The read voltages are increased until the upper tail Vt is found.

Figure 9D:
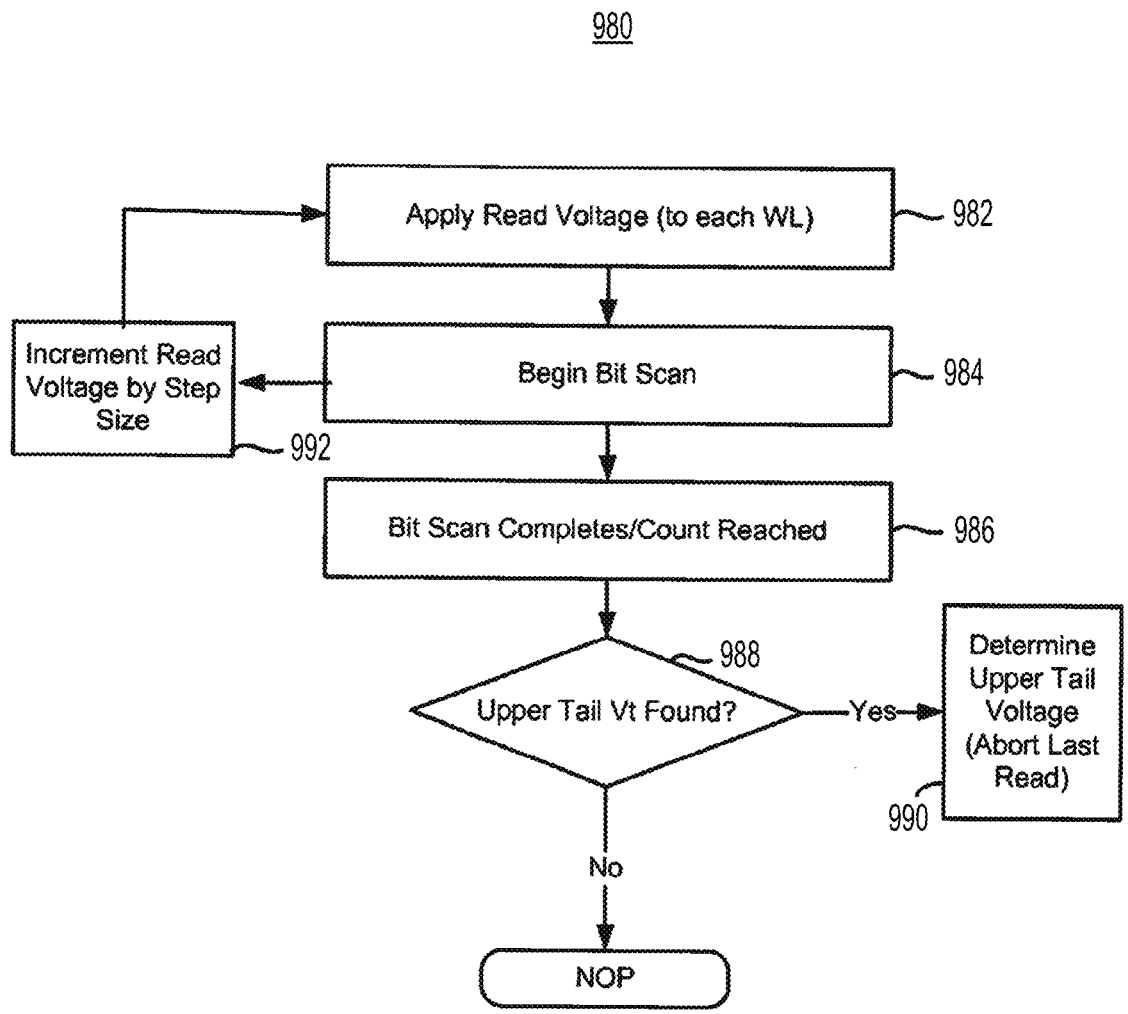
FIG. 9D depicts one embodiment of a process of performing a scan of memory cells in a block to determine an upper tail threshold voltage after a trial erase according to aspects of the disclosure.

FIG. 9D depicts one embodiment of a process 980 of performing a scan of memory cells in a block to determine an upper tail Vt after a trial erase. The process is one technique for implementing step 806 of FIG. 8. FIG. 9D will be discussed with reference to FIG. 9C.

In step 982, a read voltage is applied to the word lines of the memory cells. The first read voltage may be applied simultaneously to each word line. Thus, the first read is intended to read one condition for each entire NAND string, as opposed to a condition of each memory cell on a NAND string. However, it is not required that the first read voltage be applied simultaneously to each word line. Thus, each memory cell could be read individually.

In step 984, a bit scan based on results of the first read is begun. That is, counting of the number of NAND strings that have one or more memory cells with a Vt that is higher than the read voltage is begun. Note that the next read voltage may be applied while the counting continues because the magnitude of the next read voltage does not depend on the count. This is depicted in FIG. 9C, where the first bit scan is depicted as occurring during the second read. In process 980, this is depicted in step 992 as increasing the read voltage by the step size and returning to step 982. In step 986, the bit scan completes. The bit scan stops if the count of NAND strings reaches a certain level. For example, if 31 NAND strings are found with a memory cell having a Vt higher than the read voltage, then the bit scan is stopped.

In step 988, a determination is made as to whether or not the upper tail Vt has been found at the desired resolution. Referring to FIG. 9C, initially read voltages are at the lower end of the window. Therefore, it is expected that the maximum count will be reached for the first reads. That is, it is expected that the upper tail Vt is above the first read voltage. When the read voltage is greater than the upper tail Vt the count will not be reached indicating that the upper tail Vt is between this read and the previous. If a greater resolution is desired, then a read voltage someone between the last two read voltages is selected and control passes to step 982 to apply the new read voltage.

Otherwise, an upper tail voltage is determined based on the last two read voltages in step 990. Also, because a new read may be started when the bit scan begins, the last read may be aborted.

Simultaneous multi-threshold (SMT) sensing may also be employed. During SMT sensing, two or more different bias conditions may be used to simultaneously sense two different threshold voltages. For example, a single verify reference voltage may be applied to the selected word line, while one bias condition is used for memory cells being verified to a first state and a second bias condition is used for memory cells being verified to a second state. One example of different bias conditions is to sense the conduction current of the bit line for different lengths of times. Herein, this sense time is referred to as "FSENSE." Using two (or more) different FSENSEs allows different threshold voltages to be sensed, while applying the same verify reference voltage to the selected word line. Hence, this may be referred to as "simultaneous multi-threshold" sensing.

Using SMT sensing saves time during program verify. However, when the memory cells are later read, the bias condition that was used for each memory cell being read is not known. Therefore, all memory cells may be read using the same bias condition. For example, all memory cells may be read using a nominal (e.g., short) FSENSE. Therefore, the memory cells that were verified using a longer FSENSE would get read using a different FSENSE than was used at verify.

Note that memory cells can react differently to being read using a different bias condition than used during verify. For example, they may show different threshold voltage shifts. Ideally, all memory cells would experience the same threshold voltage shift as a result of the different bias conditions (e.g., sensing times). However, this may not be the case. The foregoing may lead to variance in the threshold voltage shifts of memory cells read with a different bias condition than used to verify.

Figure 10:
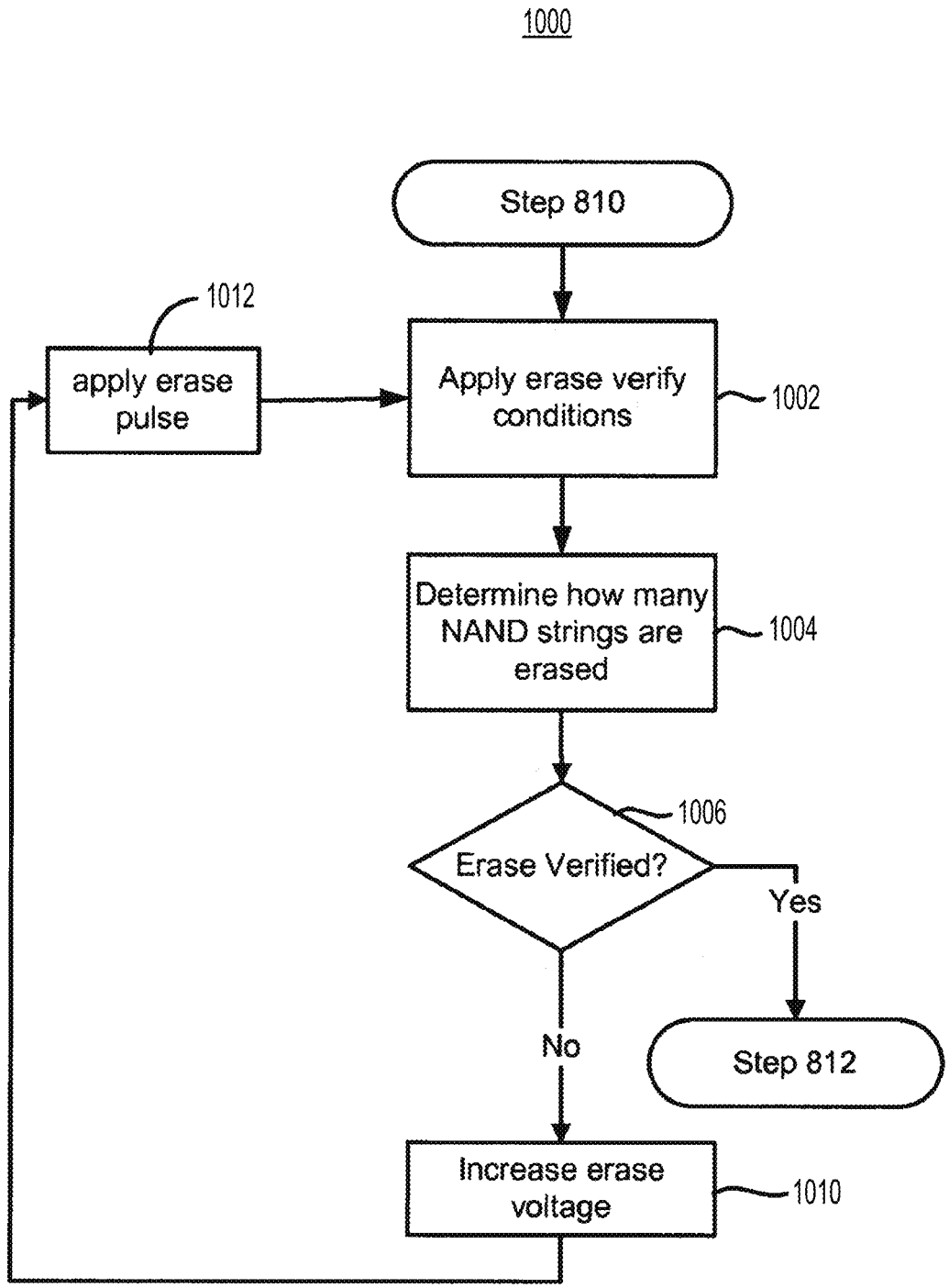
FIG. 10 is a flow chart describing a process for verifying that memory cells have been erased according to aspects of the disclosure.

FIG. 10 is a flow chart describing a process 1000 for verifying that the memory cells have been erased. In one embodiment, the process 1000 of FIG. 8B is used between steps 810 and 812 of process 800. In step 1002, a set of erase verify conditions are applied to the memory cells. In one implementation, source follower sensing is employed. Step 1002 includes discharging bit lines to ground, which may be achieved by turning on the drain side select gate (SGD). Then, a higher than zero voltage (e.g., 2.2V) is applied to the common source line and a certain voltage (e.g., 0V) is applied to the word lines. Charge builds up on the bit line of a given NAND string until the body effect turns off at least one memory cell in the NAND string.

In step 1004, each of the NAND strings is sensed to determine whether all of the memory cells on the NAND string were sufficiently erased. Step 1004 is performed after waiting for a predetermined period of time for the charge to build up on the bit line. In one implementation, the voltage on a given bit line is compared to a reference value to determine whether any of the memory cells on the corresponding NAND string have a Vt that is above the target value. The target value could be a negative value. In some implementations, the memory cells are erased to as much as −3V.

In one embodiment, if it is detected that the Vt of each memory cell on a NAND string has reached the target level, then the data stored in the corresponding data latch is changed to a logic "1." If it is detected that the NAND string has at least one memory cell with a Vt that has not reached the appropriate target level, the data stored in the corresponding data latch is not changed.

In step 1006, a determination is made as to whether enough NAND strings passed erase verification. In one implementation, a certain number of NAND strings are allowed to fail erase verification. For example, providing that fewer than 32 NAND strings failed erase verification, the overall erase verification passes. If erase passed, then control passes to step 812.

If, at step 1006, it is determined that erase verification failed, then the erase voltage is increased in step 1010. The erase voltage can be increased by any desired amount such as 0.2 V, 0.5 V, 1.0 V, etc. The new erase voltage is applied in step 1012. Then, step 1002 is performed again. Note that erase verification can be performed without the source follower technique.

As previously discussed, while it is possible to use one or more program pulses to determine the correct program voltage (VPGM) level, such a solution may not be ideal. Specifically, using multiple program pulses to determine the program voltage that should be used can cause the program operation to be slower than if multiple program pulses were not required.

Consequently, described herein is a memory apparatus (e.g., memory device 596 in FIG. 5B) including a block (e.g., BLK0 in FIG. 3) of storage elements or memory cells (e.g., storage elements 301, . . . , 302-306, . . . , 307 in FIG. 3) with each of the memory cells connected to one of a plurality of word lines (e.g., WL0-WL63 in FIG. 3). The memory cells are arranged in strings (e.g., strings NS0, NS1, . . . , NSn−1 in FIG. 3) and each is configured to retain a threshold voltage Vt or Vth within a common range of threshold voltages defining a threshold window. The apparatus also includes a control circuit (e.g., components 510, 512, 513, 514, 515, 516, 530, 550, 560, 565 in FIG. 5B) coupled to the plurality of word lines and the strings. The control circuit is configured to determine an erase upper tail voltage of a distribution of the threshold voltage of the memory cells following an erase operation. The erase upper tail voltage corresponds to a cycling condition of the memory cells. The control circuit is also configured to calculate a program voltage to apply to each of selected ones of the plurality of word lines associated with the memory cells to program the memory cells during a program operation based on the erase upper tail voltage.

As described above, the erase operation can include multiple erase pulses, for example, an initial or first erase pulse and a second erase pulse. So, the erase upper tail voltage includes an initial erase upper tail voltage or first pulse erase upper tail of the memory cells before the erase operation has completed and the erase upper tail voltage also includes the final erase upper tail voltage of the memory cells in one of the strings after the erase operation has completed.

FIG. 11(a) shows example distributions of the threshold voltage of the memory cells prior to the erase operation for a fresh block (i.e., following manufacturing and having experienced no or only a minimal number of write/erase (W/E) cycles), a block having experienced 50,000 W/E cycles, a block having experienced 120,000 W/E cycles. Next, the first erase pulse is applied at the beginning of the erase stage. Accordingly, the control circuit is further configured to apply a first erase pulse to each of the selected ones of the plurality of word lines connected to the memory cells being erased during the erase operation. FIG. 11(b) shows example distributions of the threshold voltage of the memory cells after the first erase pulse for the fresh block, the block having experienced 50,000 W/E cycles, and the block having experienced 120,000 W/E cycles. The control circuit is also configured to determine the initial erase upper tail voltage of the distribution of the threshold voltage of the memory cells being erased following the first erase pulse. In addition, the control circuit is configured to deduce the cycling condition of the memory cells being erased based on the initial erase upper tail voltage. Such a deduction is possible since higher cycled blocks have a slower erase speed (e.g., resulting in a higher initial erase upper tail voltage).

Referring back to FIG. 4, for example, each of the strings (e.g., NS0, NS1, etc.) is connected to a bit line (e.g., BL0, BL1, etc.) which is also coupled to the control circuit. Multiple erase verify can be used to detect upper tail location. This can include multiple BSPF criteria or multiple FSENSE time. Accordingly, the control circuit is further configured to determine the initial erase upper tail voltage based on at least one of a bit scan operation and using multiple sense times (i.e., FSENSE). As described above, for the bit scan operation, a count can be made of the memory cells failing to turn on in response to a particular read voltage (or trying one read voltage and then increasing or decreasing the read voltage). Alternatively, for FSENSEs, the control circuit senses a conduction current of the bit line for a plurality of sensing times while applying a verify reference voltage to each of the selected ones of the plurality of word lines to determine the threshold voltage of the memory cells being erased.

The control circuit can then calculate a voltage of a second erase pulse based on the cycling condition, so that the final erase upper tail records or reflects the cycling condition. More cycled blocks would have higher upper tail (i.e., the upper tail is associated with a relatively higher threshold voltage) whereas fresh blocks would have lower upper tail (i.e., the upper tail is associated with a relatively lower threshold voltage). Thus, the control circuit applies the second erase pulse to the selected ones of the plurality of word lines based on the cycling condition to shift the threshold voltage of the memory cells being erased to have the final upper tail or final erase upper tail voltage during the erase operation. FIG. 11(c) shows example distributions of the threshold voltage of the memory cells after the second erase pulse for the fresh block, the block having experienced 50,000 W/E cycles, and the block having experienced 120,000 W/E cycles. In the example shown in FIG. 11(c), the fresh block final erase upper tail voltage could be at 0.4V, the medium cycled block final erase upper tail voltage could be at 0.6V, and the highly cycled block final erase upper tail voltage could be at 0.8V. So, the apparatus described herein uses the first pulse erase upper tail to determine the cycling condition of the block and then uses that information to erase the final upper tail to a desired location (i.e., voltage). The erase operation finishes after the second erase pulse. Nevertheless, it should be appreciated that the control circuit could alternatively be configured to apply more than two erase pulses.

FIG. 11(d) shows example distributions of the threshold voltage of the memory cells prior to the start of the program operation for the fresh block, the block having experienced 50,000 W/E cycles, and the block having experienced 120,000 W/E cycles. Before the program operation, the memory apparatus (e.g., control circuit) can know the cycling condition of the block by reading the erase upper tail location and determine VPGM for that block to make sure all the program voltages utilized are adjusted to the cycling condition. Thus, the control circuit is further configured to determine the final erase upper tail voltage by successively reading the memory cells. Once the erase upper tail location (e.g., final erase upper tail voltage) is verified, the cycling condition of the blocks is decoded. FIG. 11(e) shows example distributions of the threshold voltage of the memory cells after the control circuit has determined the erase upper tail location for the fresh block, the block having experienced 50,000 W/E cycles, and the block having experienced 120,000 W/E cycles.

Similar to the determination of the initial erase upper tail voltage, the control circuit is configured to determine the final erase upper tail voltage based on at least one of the bit scan operation and using multiple sense times. So, for the bit scan operation, a count can be made of the memory cells failing to turn on in response to the particular read voltage (or trying one read voltage and then increasing or decreasing the read voltage). On the other hand, for multiple sense times, the control circuit senses the conduction current of the bit line for the plurality of sensing times while applying the verify reference voltage to each of the selected ones of the plurality of word lines to determine the threshold voltage of the memory cells being erased. No matter how it is determined, the upper tail location will reveal the cycling number of the block.

The control circuit is also configured to calculate the program voltage based on the final erase upper tail voltage. The program voltage may also be dependent on a desired program speed. Specifically, the program voltage modulate the program voltage to account for program speed change with write/erase (W/E) cycles (adaptive VPGM). Following the determination of the program voltage, the control circuit is configured to apply the program voltage to each of the selected ones of the plurality of word lines of the memory cells of the one of the strings (e.g., string 0) to program the memory cells during the program operation. FIG. 11(f) shows example distributions of the threshold voltage of the memory cells after the control circuit has programmed the memory cells during the program operation for the fresh block, the block having experienced 50,000 W/E cycles, and the block having experienced 120,000 W/E cycles. While the fresh block is described as having experienced no or only a minimal number of write/erase (W/E) cycles, and other blocks are described as having experienced 50,000 write/erase (W/E) cycles or having experienced 120,000 W/E cycles, it should be appreciated that these quantities of W/E cycles are merely provided as examples and other quantities of W/E cycles may instead describe fresh blocks, medium-cycled blocks, and highly-cycled blocks.

The control circuit may also include a program voltage register (e.g., register 515 of FIG. 5B). In addition, the plurality of word lines can be grouped in word line zones. Consequently, the control circuit is further configured to store the program voltage in the program voltage register. The program voltage stored in the program voltage register can then be applied to each of the selected ones of the plurality of word lines (e.g., strings 1-4) when programming memory cells connected to each of the selected ones of the plurality of word lines within one of the word line zones. The program voltage stored in the program voltage register can also be applied to the selected ones of the plurality of word lines when programming of other ones of the strings of the block of memory cells in another program operation.

For individual word line erase upper tail detection, certain offsets might be used to compensate for the word line to word line variation or offset can be applied at the erase stage so that all the word line erase upper tail or erase upper tail voltage (e.g., the initial erase upper tail voltage and/or the final erase upper tail voltage) will be at the same location (i.e., threshold voltage Vt). Thus, the control circuit may additionally configured to determine and apply an offset to at least one of the first erase pulse and the second erase pulse during the erase operation. Such an offset can ensure that at least one of the initial erase upper tail voltage and the final erase upper tail voltage are at approximately the same location in the threshold window.

FIG. 12 is a graph showing a correlation between program and erase speeds for memory cells under different cycling conditions. Specifically, an evolution at room temperature of a mean delta threshold voltage Vt (dVt) of a memory apparatus being evaluated after a program operation as compared to a fresh memory apparatus (difference between threshold voltages Vt of the memory cells of the memory apparatus being evaluated after the program operation and threshold voltages Vt of the memory cells of the fresh memory apparatus) at a specific program voltage trim setting (VPGMSLCTrim-0.5V) plotted versus a mean delta threshold voltage Vt (dVt) of the memory apparatus being evaluated after an erase operation as compared to the fresh memory apparatus (difference between threshold voltages Vt of the memory cells of the memory apparatus being evaluated after the erase operation and threshold voltages Vt of the memory cells of the fresh memory apparatus) at a specific erase voltage (VERA=14.8V). The evaluation or testing was included the memory cells being evaluated experience repeated program and erase operations (0 cycles, 10,000 (10 k) cycles, 20,000 (20 k) cycles, 30,000 (30 k) cycles, 40,000 (40 k) cycles, 50,000 (50 k) cycles, . . . 120,000 (120 k) cycles) and each cluster shown is from one program and erase (WE) condition. The program operation used in the evaluation was done pulse-by-pulse programming and the erase operation was also done pulse-by-pulse. A total of four memory apparatuses were tested, each with two blocks, and all strings. The data shown in FIG. 12 is for word line WL47 only; however, other word lines show a similar correlation. As illustrated, there is a very good correlation between the program and erase speed change after program and erase (WE) operations. In more detail, in the data shown, the program speed seems to be approximately 1.2 times the erase speed depending on the program and erase (WE) operations. So, due to such correlation, for every dVt after the erase operation, a corresponding program voltage VPGM can be calculated depending on the number of cycles that the cells of the memory apparatus have experienced.

FIG. 13 is a graph showing an average lower tail (desired lower tail position) following the program operation versus the program voltage for a fresh memory apparatus and one that has experienced 75,000 program and erase cycles. The data shown is after a first program pulse of the program operation. The program slope (approximately 0.6 volts) is the same for fresh blocks and blocks that have experienced 75,000 program and erase cycles. As shown, the program speed (speed of the program operation) of the cycled block (one that has experienced 75,000 program and erase cycles) shown is approximately 0.3 volts faster than the fresh block the cycled blocks. So, the program voltage VPGM can be based on the lower tail, which relates to the cycling condition or how many cycles the memory cells of the memory apparatus have experienced.

Now referring to FIG. 14, a method of operating a memory apparatus is also provided. As discussed above, the memory apparatus includes a block of memory cells. Each of the memory cells is connected to one of a plurality of word lines and the memory cells are arranged in strings. Each of the memory cells is configured to retain a threshold voltage within a common range of threshold voltages defining a threshold window. Thus, the method includes the step of 1100 determining an erase upper tail voltage of a distribution of the threshold voltage of the memory cells following an erase operation, the erase upper tail voltage corresponding to a cycling condition of the memory cells. The method continues with the step of 1102 calculating a program voltage to apply to each of selected ones of the plurality of word lines associated with the memory cells to program the memory cells during a program operation based on the erase upper tail voltage.

Because the erase operation can include multiple erase pulses, for example, an initial or first erase pulse and a second erase pulse the erase upper tail voltage includes an initial erase upper tail voltage of the memory cells before the erase operation has completed. So, the method further includes the step of applying a first erase pulse to each of the selected ones of the plurality of word lines connected to the memory cells being erased during the erase operation. The method continues by determining the initial erase upper tail voltage of the distribution of the threshold voltage of the memory cells being erased following the first erase pulse.

The method further includes the step of deducing the cycling condition of the memory cells being erased based on the initial erase upper tail voltage. Next, applying a second erase pulse to the selected ones of the plurality of word lines based on the cycling condition to shift the threshold voltage of the memory cells being erased to have a final erase upper tail voltage during the erase operation.

Again, the erase upper tail voltage includes a final erase upper tail voltage of the memory cells in one of the strings after the erase operation has completed. Thus, the method further includes the step of determining the final erase upper tail voltage by successively reading the memory cells. The method proceeds with the step of calculating the program voltage based on the final erase upper tail voltage. The next step of the method is applying the program voltage to each of the selected ones of the plurality of word lines of the memory cells of the one of the strings to program the memory cells during the program operation.

The method can further include the step of determining and applying an offset to at least one of the first erase pulse and the second erase pulse during the erase operation to ensure that at least one of the initial erase upper tail voltage and the final erase upper tail voltage are at approximately the same location in the threshold window.

As mentioned above, the memory apparatus can include a program voltage register and the plurality of word lines may be grouped in word line zones. Accordingly, the method can further include the step of storing the program voltage in the program voltage register to be applied to each of the selected ones of the plurality of word lines when programming memory cells connected to each of the selected ones of the plurality of word lines within one of the word line zones and memory cells of other ones of the strings of the block of memory cells in another program operation.

Clearly, changes may be made to what is described and illustrated herein without, however, departing from the scope defined in the accompanying claims. The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

The terminology used herein is for the purpose of describing particular example embodiments only and is not intended to be limiting. As used herein, the singular forms "a," "an," and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

When an element or layer is referred to as being "on," "engaged to," "connected to," or "coupled to" another element or layer, it may be directly on, engaged, connected or coupled to the other element or layer, or intervening elements or layers may be present. In contrast, when an element is referred to as being "directly on," "directly engaged to," "directly connected to," or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

Although the terms first, second, third, etc. may be used herein to describe various elements, components, regions, layers and/or sections, these elements, components, regions, layers and/or sections should not be limited by these terms. These terms may be only used to distinguish one element, component, region, layer or section from another region, layer or section. Terms such as "first," "second," and other numerical terms when used herein do not imply a sequence or order unless clearly indicated by the context. Thus, a first element, component, region, layer or section discussed below could be termed a second element, component, region, layer or section without departing from the teachings of the example embodiments.

Spatially relative terms, such as "inner," "outer," "beneath," "below," "lower," "above," "upper," "top", "bottom", and the like, may be used herein for ease of description to describe one element's or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptions used herein interpreted accordingly.

What is claimed is:

1. An apparatus, comprising:
    a block of memory cells, each of the memory cells connected to one of a plurality of word lines and arranged in strings and configured to retain a threshold voltage within a common range of threshold voltages defining a threshold window;
    a control circuit coupled to the plurality of word lines and the strings and configured to:
        apply a first erase pulse to each of selected ones of the plurality of word lines connected to the memory cells being erased during an erase operation,
        determine an initial erase upper tail voltage of a distribution of the threshold voltage of the memory cells following the first erase pulse of the erase operation, the initial erase upper tail voltage corresponding to a cycling condition of the memory cells,
        apply a second erase pulse of a voltage calculated based on the cycling condition to each of the selected ones of the plurality of word lines to shift the threshold voltage of the memory cells being erased to have a final erase upper tail voltage that records the cycling condition in the final erase upper tail itself during the erase operation, and
        calculate a program voltage to apply to each of the selected ones of the plurality of word lines associated with the memory cells to program the memory cells during a program operation based on the final erase upper tail voltage.

2. The apparatus as set forth in claim 1, wherein the control circuit is further configured to:
    deduce the cycling condition of the memory cells being erased based on the initial erase upper tail voltage.

3. The apparatus as set forth in claim 2, wherein the control circuit is further configured to determine and apply an offset to at least one of the first erase pulse and the second erase pulse during the erase operation to ensure that at least one of the initial erase upper tail voltage and the final erase upper tail voltage are at approximately the same location in the threshold window.

4. The apparatus as set forth in claim 1, wherein each of the strings is connected to a bit line coupled to the control circuit and the control circuit is further configured to determine the initial erase upper tail voltage based on at least one of a bit scan operation in which a count is made of the memory cells failing to turn on in response to a particular read voltage and sensing a conduction current of the bit line for a plurality of sensing times while applying a verify reference voltage to each of the selected ones of the plurality of word lines to determine the threshold voltage of the memory cells being erased.

5. The apparatus as set forth in claim 1, wherein the control circuit includes a program voltage register and the plurality of word lines are grouped in word line zones and the control circuit is further configured to store the program voltage in the program voltage register to be applied to each of the selected ones of the plurality of word lines when programming memory cells of ones of the strings connected to each of the selected ones of the plurality of word lines within one of the word line zones and memory cells of other ones of the strings of the block of memory cells in another program operation.

6. The apparatus as set forth in claim 1, wherein the control circuit is further configured to:
    determine the final erase upper tail voltage by successively reading the memory cells, and
    apply the program voltage to each of the selected ones of the plurality of word lines of the memory cells of the one of the strings to program the memory cells during the program operation.

7. The apparatus as set forth in claim 6, wherein each of the strings is connected to a bit line coupled to the control circuit and the control circuit is further configured to determine the final erase upper tail voltage based on at least one of a bit scan operation in which a count is made of the memory cells failing to turn on in response to a particular read voltage and sensing a conduction current of the bit line for a plurality of sensing times while applying a verify reference voltage to each of the selected ones of the plurality of word lines to determine the threshold voltage of the memory cells being erased.

8. A controller in communication with a memory apparatus including a block of memory cells, each of the memory cells connected to one of a plurality of word lines and arranged in strings and configured to retain a threshold voltage within a common range of threshold voltages defining a threshold window, the controller configured to:
   instruct the memory apparatus to apply a first erase pulse to each of selected ones of the plurality of word lines connected to the memory cells being erased during the erase operation,
   determine an initial erase upper tail voltage of a distribution of the threshold voltage of the memory cells following the first erase pulse of the erase operation, the initial erase upper tail voltage corresponding to a cycling condition of the memory cells,
   instruct the memory apparatus to apply a second erase pulse of a voltage calculated based on the cycling condition to the selected ones of the plurality of word lines to shift the threshold voltage of the memory cells being erased to have a final erase upper tail voltage that records the cycling condition in the final erase upper tail itself during the erase operation, and
   calculate a program voltage to apply to each of the selected ones of the plurality of word lines associated with the memory cells to program the memory cells during a program operation based on the final erase upper tail voltage.

9. The controller as set forth in claim 8, wherein the controller is further configured to:
   deduce the cycling condition of the memory cells being erased based on the initial erase upper tail voltage.

10. The controller as set forth in claim 9, wherein the controller is further configured to determine and apply an offset to at least one of the first erase pulse and the second erase pulse during the erase operation to ensure that at least one of the initial erase upper tail voltage and the final erase upper tail voltage are at approximately the same location in the threshold window.

11. The controller as set forth in claim 8, wherein the controller is in communication with a program voltage register and the plurality of word lines are grouped in word line zones and the controller is further configured to store the program voltage in the program voltage register to be applied to each of the selected ones of the plurality of word lines when programming memory cells of ones of the strings connected to each of the selected ones of the plurality of word lines within one of the word line zones and memory cells of other ones of the strings of the block of memory cells in another program operation.

12. The controller as set forth in claim 8, wherein the controller is further configured to:
   determine the final erase upper tail voltage by successively instructing the memory apparatus to read the memory cells, and
   instruct the memory apparatus apply the program voltage to each of the selected ones of the plurality of word lines of the memory cells of the one of the strings to program the memory cells during the program operation.

13. A method of operating a memory apparatus including a block of memory cells, each of the memory cells connected to one of a plurality of word lines and arranged in strings and configured to retain a threshold voltage within a common range of threshold voltages defining a threshold window, the method comprising the steps of:
   applying a first erase pulse to each of selected ones of the plurality of word lines connected to the memory cells being erased during the erase operation;
   determining an initial erase upper tail voltage of a distribution of the threshold voltage of the memory cells following the first erase pulse of the erase operation, the initial erase upper tail voltage corresponding to a cycling condition of the memory cells;
   applying a second erase pulse of a voltage calculated based on the cycling condition to the selected ones of the plurality of word lines to shift the threshold voltage of the memory cells being erased to have a final erase upper tail voltage that records the cycling condition in the final erase upper tail itself during the erase operation; and
   calculating a program voltage to apply to each of selected ones of the plurality of word lines associated with the memory cells to program the memory cells during a program operation based on the final erase upper tail voltage.

14. The method as set forth in claim 13, wherein the method further includes the steps of:
   deducing the cycling condition of the memory cells being erased based on the initial erase upper tail voltage.

15. The method as set forth in claim 14, wherein the method further includes the step of determining and applying an offset to at least one of the first erase pulse and the second erase pulse during the erase operation to ensure that at least one of the initial erase upper tail voltage and the final erase upper tail voltage are at approximately the same location in the threshold window.

16. The method as set forth in claim 13, wherein the memory apparatus includes a program voltage register and the plurality of word lines are grouped in word line zones and the method further includes the step of storing the program voltage in the program voltage register to be applied to each of the selected ones of the plurality of word lines when programming memory cells of ones of the strings connected to each of the selected ones of the plurality of word lines within one of the word line zones and memory cells of other ones of the strings of the block of memory cells in another program operation.

17. The method as set forth in claim 13, wherein the method further includes the steps of:
   determining the final erase upper tail voltage by successively reading the memory cells; and
   applying the program voltage to each of the selected ones of the plurality of word lines of the memory cells of the one of the strings to program the memory cells during the program operation.

18. The apparatus as set forth in claim 1, wherein the control circuit is further configured to:
   encode the cycling condition in the final erase upper tail voltage during the erase operation; and
   decode the cycling condition from the final erase upper tail voltage during the program operation.

19. The apparatus as set forth in claim 1, wherein the final erase upper tail voltage is a first voltage, a second voltage, or a third voltage; the second voltage is greater than the first voltage and the third voltage is greater than the second voltage; the cycling condition is fresh, a medium cycled, or highly cycled; and the control circuit is further configured to shift the threshold voltage of the memory cells being erased to have the final erase upper tail voltage as the first voltage for the fresh cycling condition and the second voltage for the medium cycled cycling condition and the third voltage for the highly cycled cycling condition during the erase operation.

\* \* \* \* \*